US012706172B2

(12) United States Patent
Amin et al.

(10) Patent No.: US 12,706,172 B2
(45) Date of Patent: Aug. 11, 2026

(54) FASTER METHOD TO PREVENT HYBRID SINGLE LEVEL CELL DEFECTS IN SYSTEM

(71) Applicant: Sandisk Technologies, Inc., Milpitas, CA (US)

(72) Inventors: Parth Amin, Fremont, CA (US); Anubhav Khandelwal, San Jose, CA (US); Mahim Gupta, San Jose, CA (US); Piyush A. Dhotre, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 18 days.

(21) Appl. No.: 18/891,932

(22) Filed: Sep. 20, 2024

(65) Prior Publication Data

US 2026/0088115 A1 Mar. 26, 2026

(51) Int. Cl.
*G11C 29/10* (2006.01)
*G11C 11/56* (2006.01)

(52) U.S. Cl.
CPC .............. *G11C 29/10* (2013.01); *G11C 11/56* (2013.01)

(58) Field of Classification Search
CPC ................................ G11C 29/10; G11C 11/56
See application file for complete search history.

(56) References Cited

U.S. PATENT DOCUMENTS 9,514,837 B2 12/2016 Shapira et al.
9,633,740 B1 * 4/2017 Alhussien .......... H03M 13/1125
10,163,500 B1 * 12/2018 Yu ...................... G06F 11/1072
11,069,425 B2 7/2021 Baca et al.
11,488,684 B1 11/2022 Sharon et al.
11,756,637 B2 9/2023 Ionin et al.
12,147,700 B2 * 11/2024 Wang .................... G06F 3/0679
2014/0126288 A1 * 5/2014 Burger ................ G06F 11/1072 365/185.03
2017/0236592 A1 * 8/2017 Alhussien ............ G11C 7/1006 714/721
2023/0085776 A1 3/2023 Bassa et al.
2023/0377657 A1 11/2023 Yang et al.
2023/0393932 A1 12/2023 Fisher

FOREIGN PATENT DOCUMENTS

CN 113918091 A 1/2022

* cited by examiner

*Primary Examiner* — Cynthia Britt
(74) *Attorney, Agent, or Firm* — Dickinson Wright PLLC

(57) ABSTRACT

A memory apparatus includes memory cells configured to retain a threshold voltage corresponding to data states. The memory cells are grouped into blocks and operable as one of single-level cells storing one bit of data per each of the memory cells or multi-level cells storing a plurality of bits of the data per each of the memory cells. A control means is configured to determine whether the memory cells of one of the blocks were previously used as the multi-level cells. The control means is also configured to determine the memory cells of the one of the blocks should be used as the multi-level cells only in response to determining the memory cells of one of the blocks were previously used as the multi-level cells and an occurrence of at least one failure to decode the data of the memory cells of the one of the blocks.

20 Claims, 16 Drawing Sheets

Figure 13:
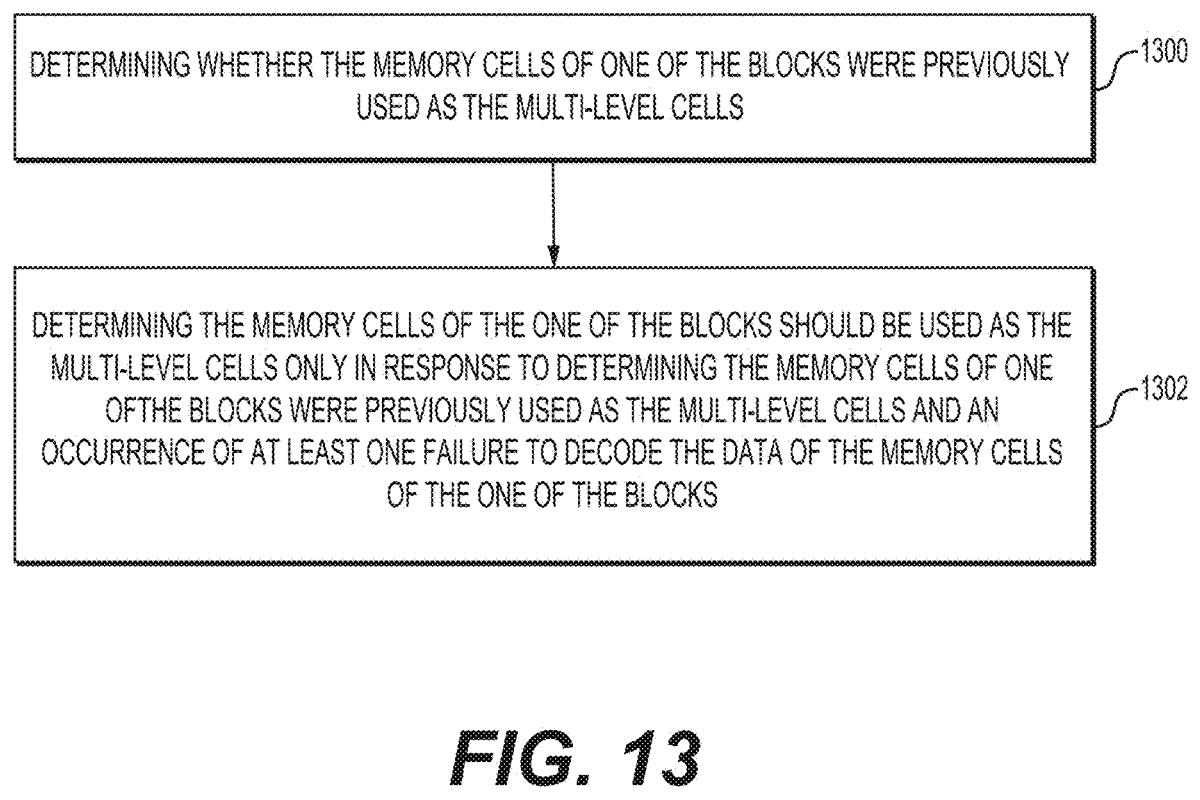

DETERMINING WHETHER THE MEMORY CELLS OF ONE OF THE BLOCKS WERE PREVIOUSLY USED AS THE MULTI-LEVEL CELLS

1300

DETERMINING THE MEMORY CELLS OF THE ONE OF THE BLOCKS SHOULD BE USED AS THE MULTI-LEVEL CELLS ONLY IN RESPONSE TO DETERMINING THE MEMORY CELLS OF ONE OFTHE BLOCKS WERE PREVIOUSLY USED AS THE MULTI-LEVEL CELLS AND AN OCCURRENCE OF AT LEAST ONE FAILURE TO DECODE THE DATA OF THE MEMORY CELLS OF THE ONE OF THE BLOCKS

FASTER METHOD TO PREVENT HYBRID SINGLE LEVEL CELL DEFECTS IN SYSTEM

FIELD

The present technology relates to the operation of memory devices.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the shortcomings described herein.

Accordingly, it is an aspect of the present disclosure to provide a memory apparatus including memory cells configured to retain a threshold voltage corresponding to one of a plurality of data states. The memory cells are grouped into blocks and operable as one of single-level cells storing one bit of data per each of the memory cells or multi-level cells storing a plurality of bits of the data per each of the memory cells. A control means is configured to determine whether the memory cells of one of the blocks were previously used as the multi-level cells. The control means is also configured to determine the memory cells of the one of the blocks should be used as the multi-level cells only in response to determining the memory cells of one of the blocks were previously used as the multi-level cells and an occurrence of at least one failure to decode the data of the memory cells of the one of the blocks.

According to another aspect of the disclosure, a controller in communication with a memory apparatus including memory cells configured to retain a threshold voltage corresponding to one of a plurality of data states is also provided. The memory cells are grouped into blocks and operable as one of single-level cells storing one bit of data per each of the memory cells or multi-level cells storing a plurality of bits of the data per each of the memory cells. The controller is configured to instruct the memory apparatus to determine whether the memory cells of one of the blocks were previously used as the multi-level cells. The controller is additionally configured to determine the memory cells of the one of the blocks should be used as the multi-level cells only in response to determining the memory cells of one of the blocks were previously used as the multi-level cells and an occurrence of at least one failure to decode the data of the memory cells of the one of the blocks.

According to an additional aspect of the disclosure, a method of operating a memory apparatus is provided. The memory apparatus includes memory cells configured to retain a threshold voltage corresponding to one of a plurality of data states. The memory cells are grouped into blocks and operable as one of single-level cells storing one bit of data per each of the memory cells or multi-level cells storing a plurality of bits of the data per each of the memory cells. The method includes the step of determining whether the memory cells of one of the blocks were previously used as the multi-level cells. The method also includes the step of determining the memory cells of the one of the blocks should be used as the multi-level cells only in response to determining the memory cells of one of the blocks were previously used as the multi-level cells and an occurrence of at least one failure to decode the data of the memory cells of the one of the blocks.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 9A:
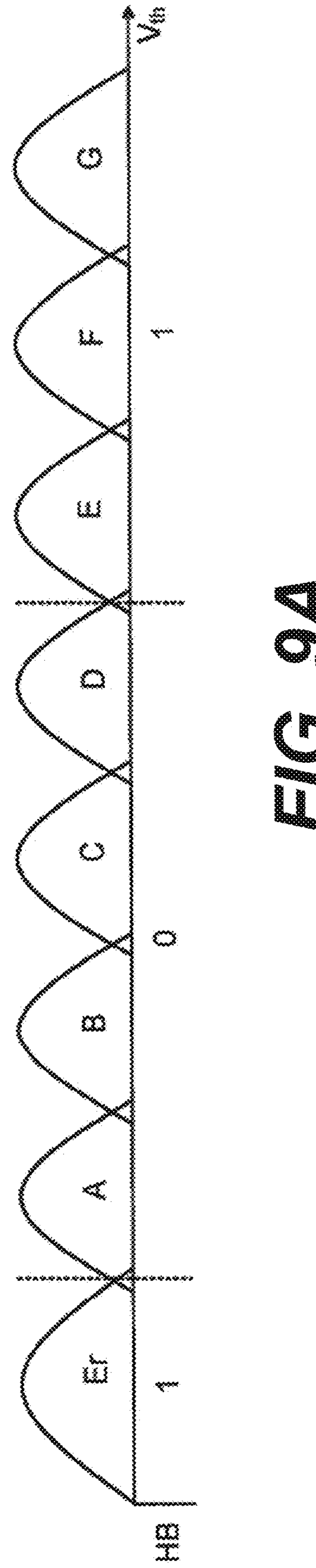
Figure 9B:
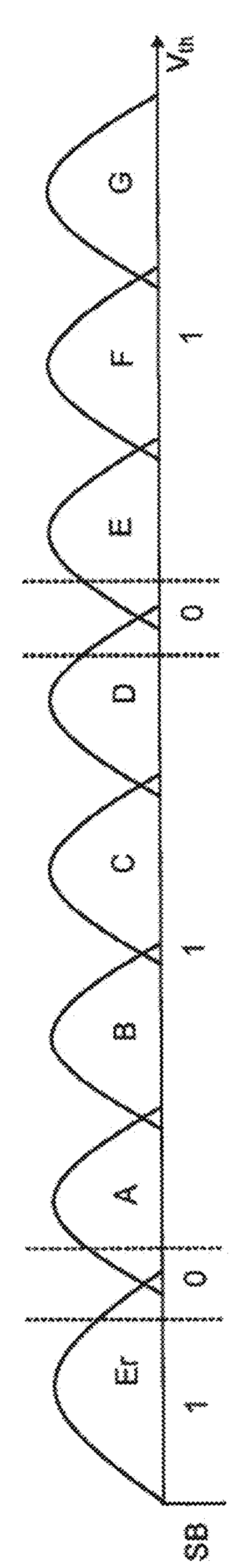
Figures 10, 11:
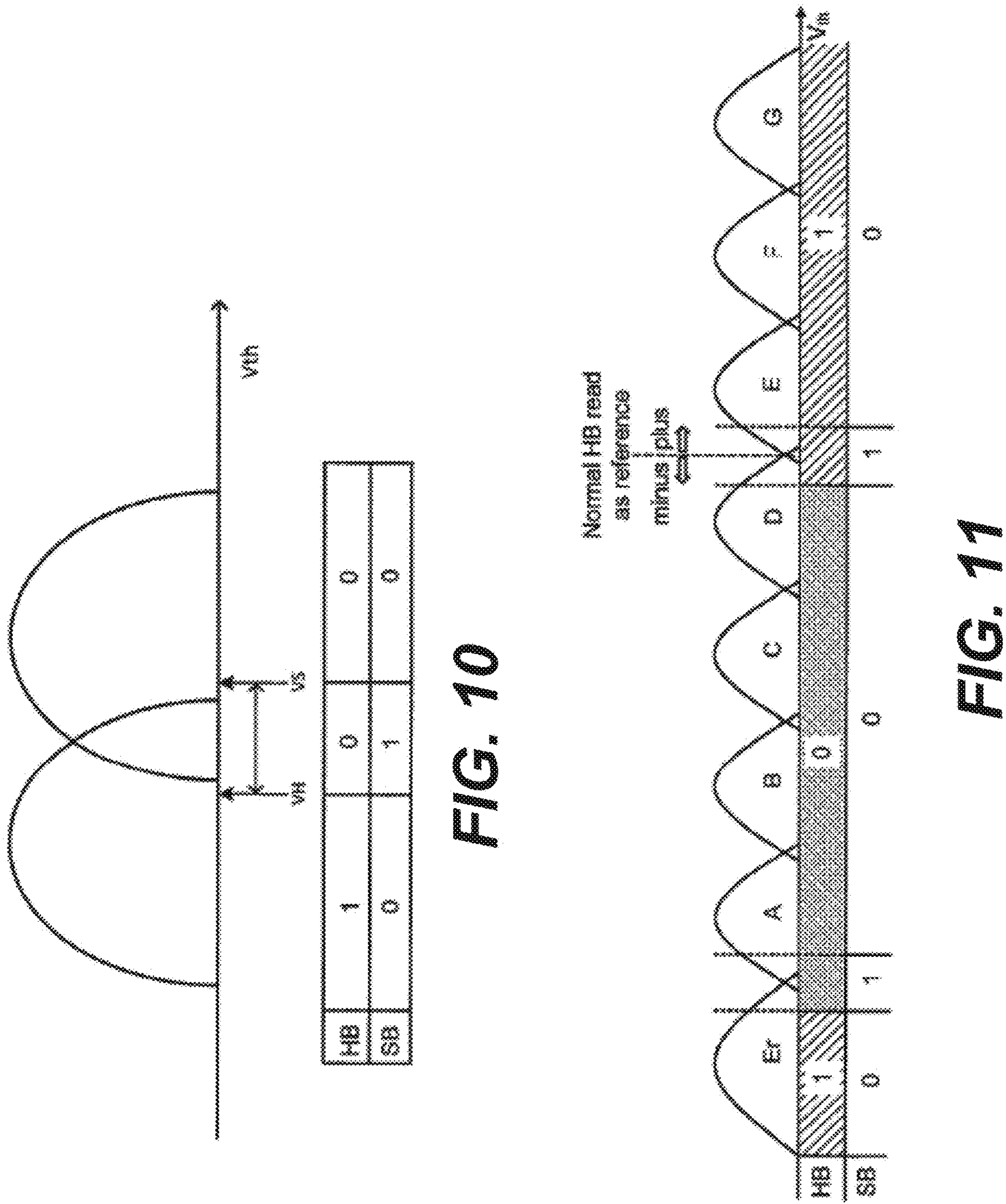
Figure 12:
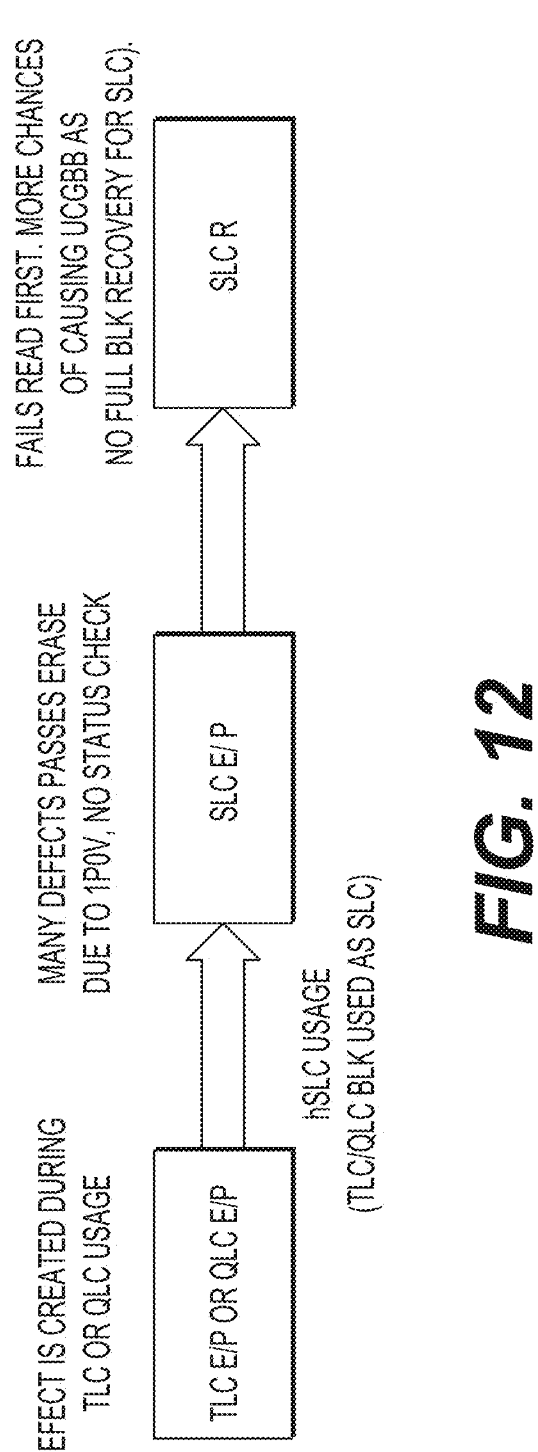
Figure 14:
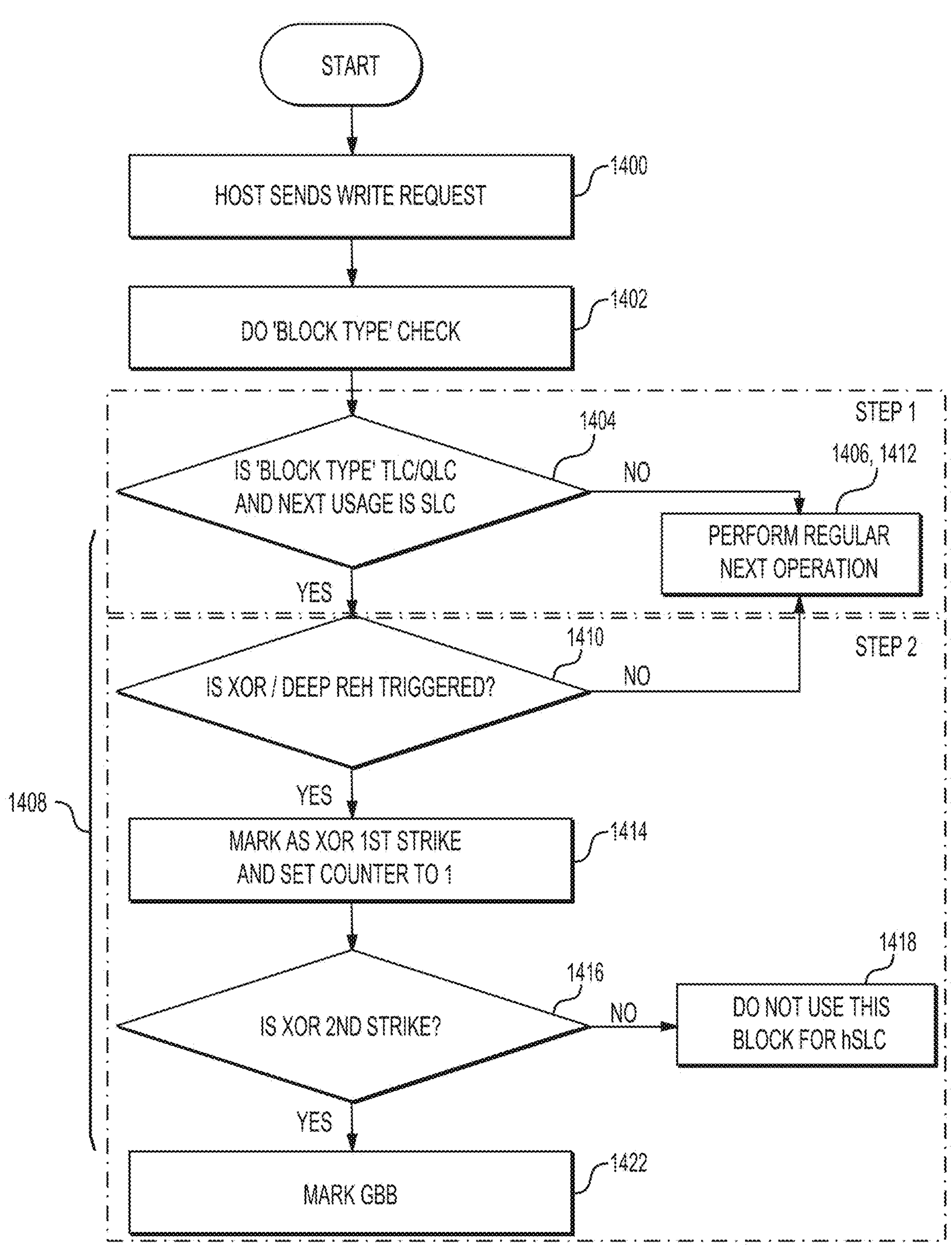
Figure 15:
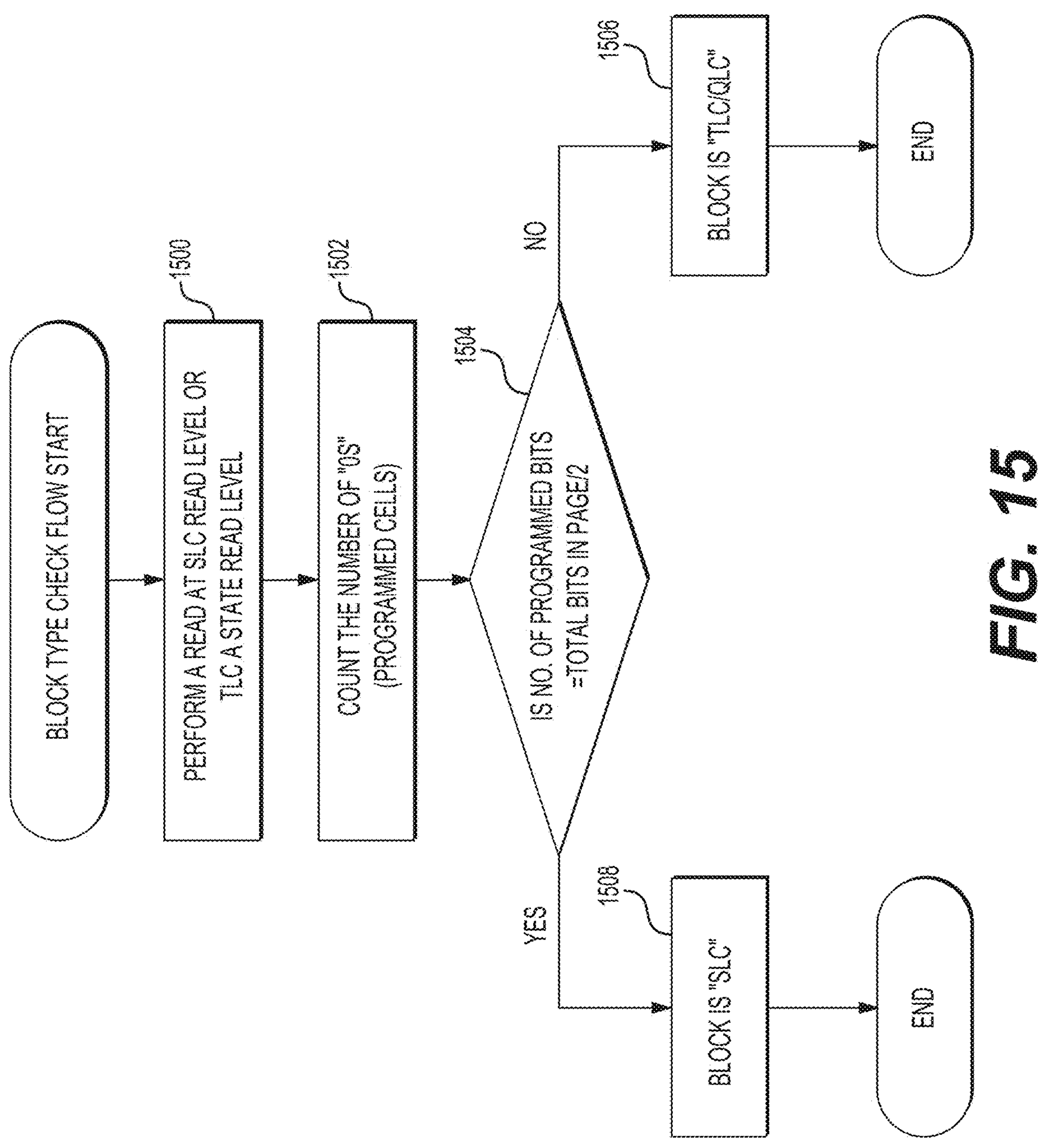

FIGS. 9A and 9B respectively illustrate the read levels for computing hard bit and soft bit values for the lower page of data in a three bits of data per memory cell embodiment according to aspects of the disclosure;

FIG. 10 illustrates the assignment of hard bit and soft bit values and the read levels used in an embodiment for efficient soft sensing according to aspects of the disclosure;

FIG. 11 illustrates the application of efficient soft sense mode to lower page data in a three bits of data per memory cell embodiment using the encoding of Table 2 according to aspects of the disclosure;

FIG. 12 shows an example sequence of usage of memory cells in a hybrid SLC memory apparatus and illustrates possible issues when the memory cells are first used as triple-level cell (TLC)/quad-level cell (QLC) before being used as SLC according to aspects of the disclosure; and FIGS. 13-15 illustrate steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side select gate SG transistors (SGD transistors), on a drain-side of the NAND string which is connected to a bit line, and one or more source-side select gate SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge-trapping layer.

A programming operation for a set of memory cells typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed data state) different from the erased state. For example, in a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 5C). In a four-bit per cell memory device, there are sixteen data states including the erased state and fifteen higher data states referred to as the Er or S0, S1, S2, S3, S4, S5, S6, S7, S8, S9, S10, S11, S12, S13, S14 and S15 data states (see FIGS. 5D and 5E).

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. For example, in FIG. 5C, a memory cell which is to be programmed to the A data state can be subject to verify tests at VvA, a verify voltage of the A data state.

Pseudo single-level cell (SLC) (pSLC), hybrid SLC (hSLC), or dynamic SLC (dSLC) is a widely accepted method to boost system performance for triple-level cell (TLC)/quad-level cell (QLC) memory devices or apparatuses. By initially saving incoming user data in SLC format to the memory device, the user can experience fast SLC performance. Then, in the background (e.g., when the host system is idle) for example, three SLC pages can be folded to TLC pages, or four SLC pages can be folded to QLC pages to maintain drive capacity. Thus, because the later sustaining performance is more dependent on background operation, faster SLC program time Tprog during the earlier burst performance is helpful for overall system performance. Nevertheless, various challenges may be encountered when the memory cells of a hybrid SLC memory apparatus are first used, for example, as triple-level cell (TLC)/quad-level cell (QLC) and later as SLC.

Figure 1:
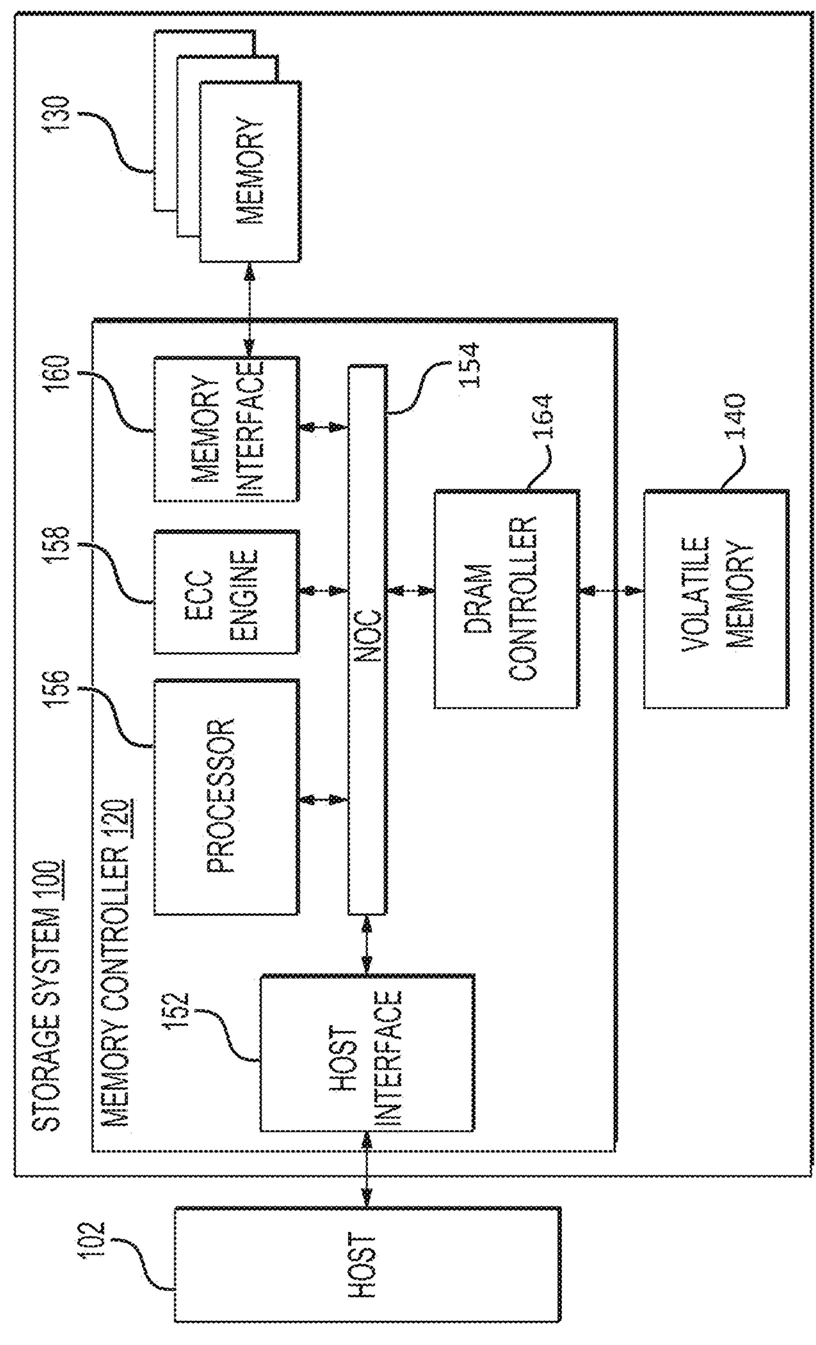
FIG. 1 is a block diagram depicting one embodiment of a storage system according to aspects of the disclosure.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
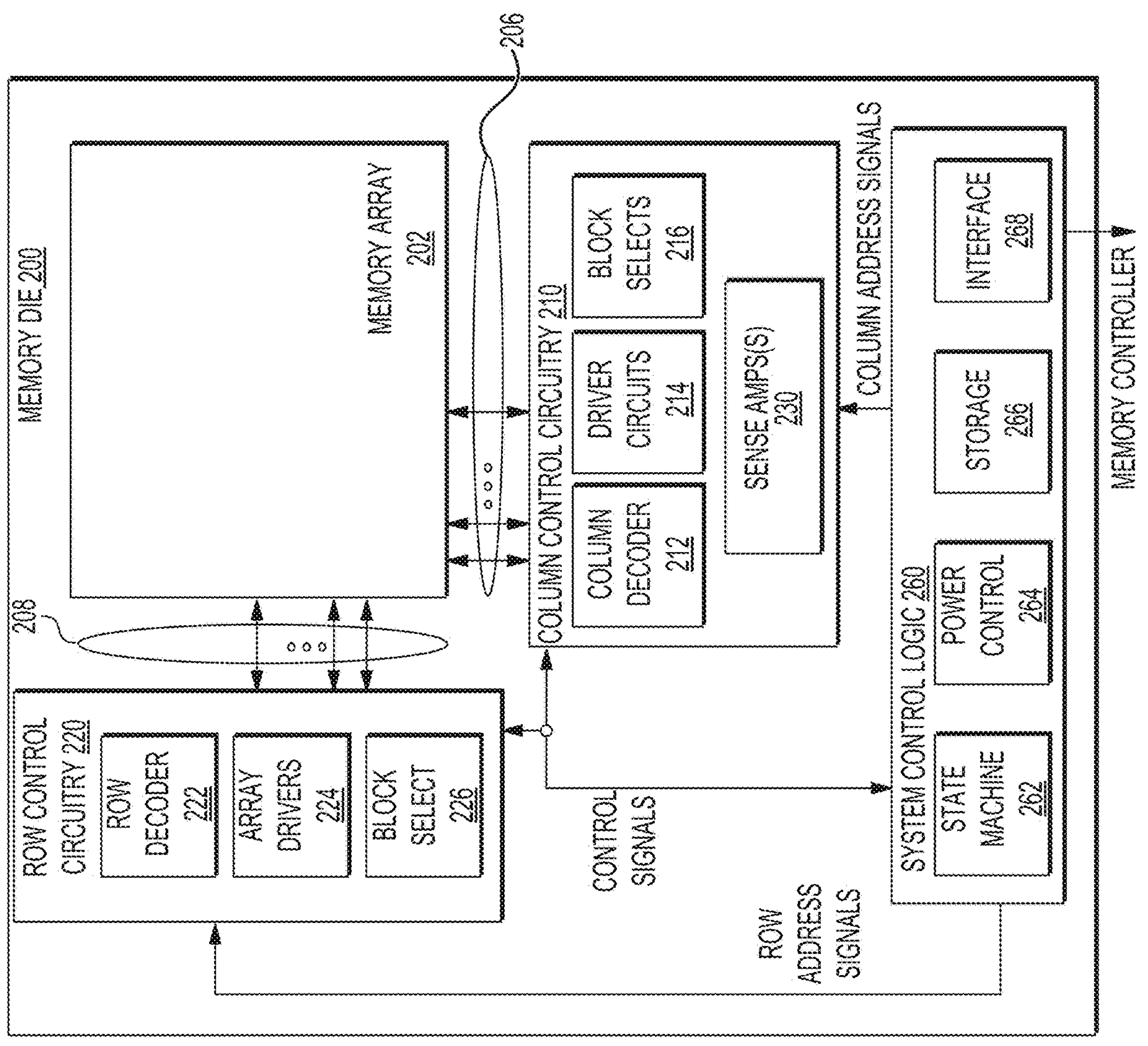
FIG. 2A is a block diagram of one embodiment of a memory die according to aspects of the disclosure.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a microcontroller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 360, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
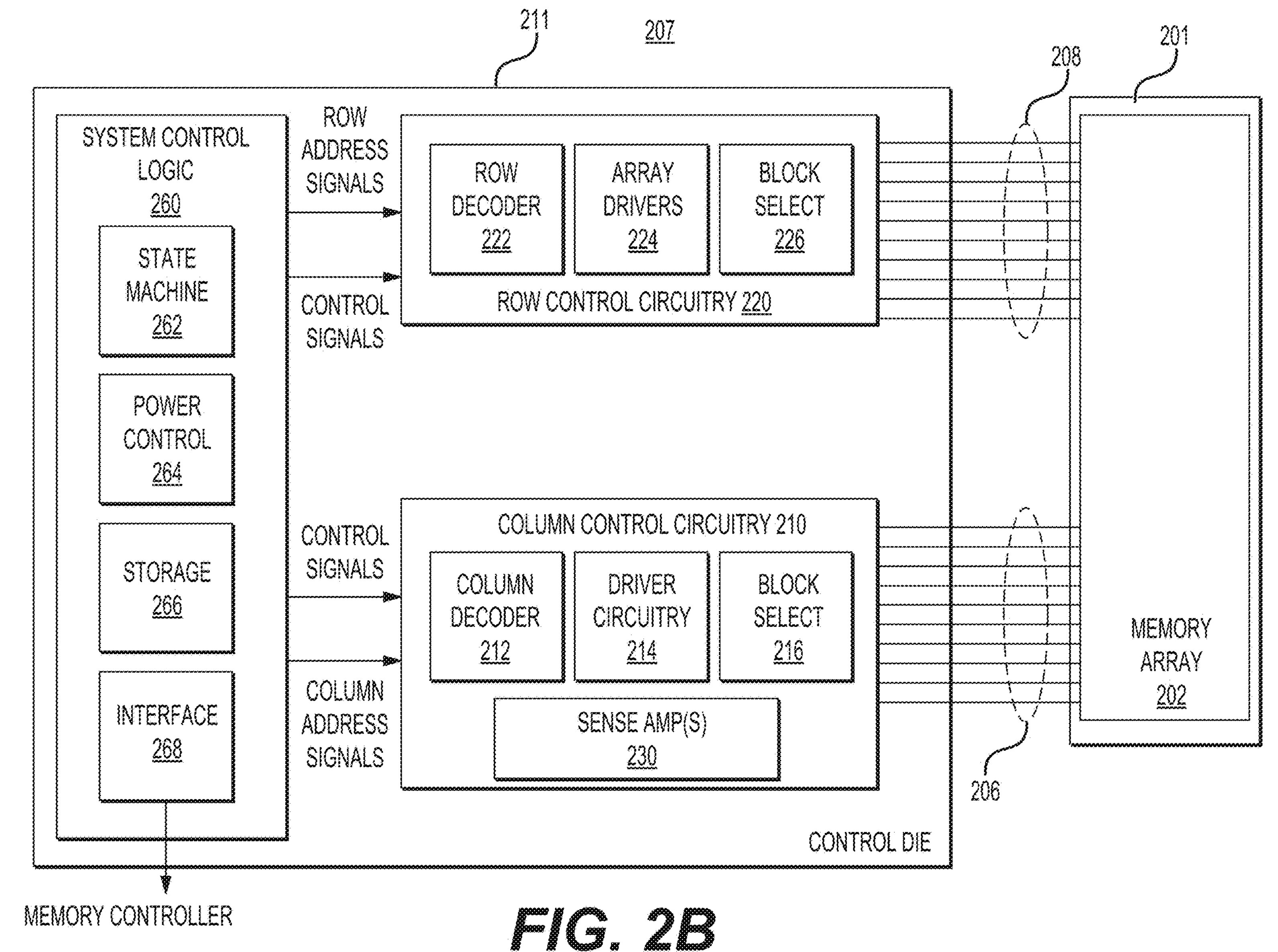
FIG. 2B is a block diagram of one embodiment of an integrated memory assembly according to aspects of the disclosure.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 307 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 311 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 311 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit. In some embodiments, there is more than one control die 211 and more than one memory die 201 in an integrated memory assembly 207. In some embodiments, the integrated memory assembly 207 includes a stack of multiple control die 211 and multiple memory die 201.

Figure 3:
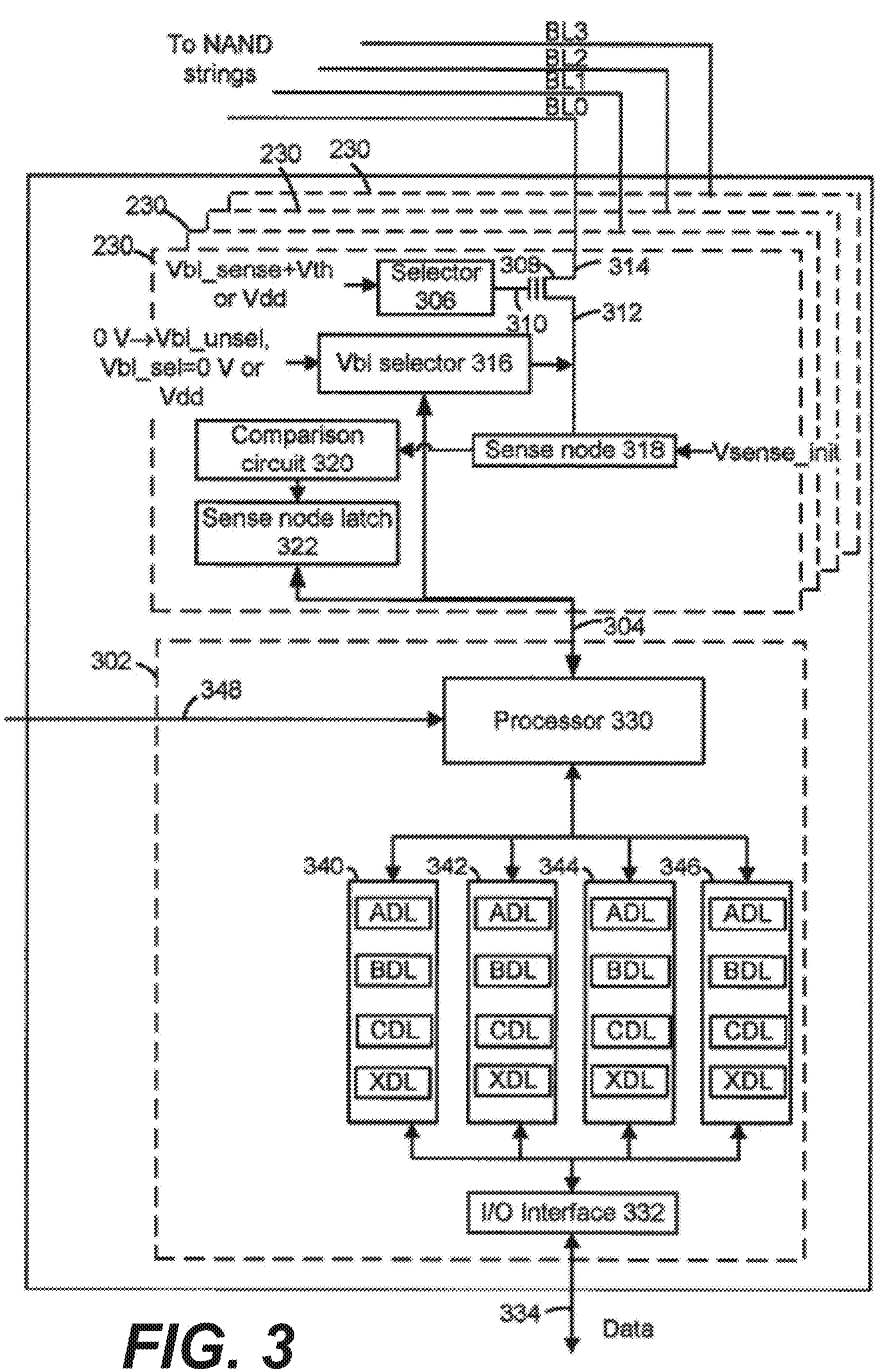
FIG. 3 depicts circuitry used to sense data from non-volatile memory according to aspects of the disclosure.

FIG. 3 is a block diagram depicting one embodiment of a portion of column control circuitry 210 that is partitioned into a plurality of sense amplifiers 230, and a common portion, referred to as a managing circuit 302. In one embodiment, each sense amplifier 230 is connected to a respective bit line which in turn is connected to one or more NAND strings. In one example implementation, each bit line is connected to six NAND strings, with one NAND string per sub-block. Managing circuit 302 is connected to a set of multiple (e.g., four, eight, etc.) sense amplifiers 230. Each of the sense amplifiers 230 in a group communicates with the associated managing circuit via data bus 304.

Each sense amplifier 230 operates to provide voltages to bit lines (see BL0, BL1. BL2. BL3) during program, verify, erase and read operations. Sense amplifiers are also used to sense the condition (e.g., data state) to a memory cells in a NAND string connected to the bit line that connects to the respective sense amplifier.

Each sense amplifier 230 includes a selector 306 or switch connected to a transistor 308 (e.g., an NMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) at the source 314 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 306 may pass a power supply voltage Vdd, (e.g., 3-4 V) to the control gate of the transistor 308 to cause it to operate as a pass gate.

When the voltage at the control gate is lower than the voltage on the drain, the transistor 308 operates as a source-follower to set or clamp the bit line voltage at Vcg-Vth, where Vcg is the voltage on the control gate 310 and Vth, e.g., 0.7 V, is the threshold voltage of the transistor 308. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as Vdd to the drain 312, which is higher than the control gate voltage on the transistor 308, to provide the source-follower mode during sensing operations. Vbl refers to the bit line voltage.

The Vbl selector 316 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 316 can pass a program-enable voltage signal such as 0 V for respective bit lines of selected NAND strings during a program loop.

In one approach, the selector 306 of each sense circuit can be controlled separately from the selectors of other sense circuits. The Vbl selector 316 of each sense circuit can also be controlled separately from the Vbl selectors of other sense circuits.

During sensing, a sense node 318 is charged up to an initial voltage, Vsense_init, such as 3 V. The sense node is then passed to the bit line via the transistor 308, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell≤Iref, the memory cell is in a non-conductive state and if Icell>ref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or program level in a next program loop. L Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or less than four can be implemented. In one embodiment, there is one set of latches for each sense amplifier 230. One set of three data latches, e.g., comprising individual latches ADL, BDL, CDL and XDL, can be provided for each sense circuit. In some cases, a different number of data latches may be used. In a three bit per memory cell embodiment, ADL stores a bit for a lower page of data, BDL stores a bit for a middle page of data, CDL stores a bit for an upper page of data and XDL serves as an interface latch for storing/latching data from the memory controller.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the program pulse magnitude.

The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two are in agreement, processor 330 sets the bit line in a program inhibit mode such as by updating its latches. This inhibits the memory cell coupled to the bit line from further programming even if additional program pulses are applied to its control gate.

Figure 4:
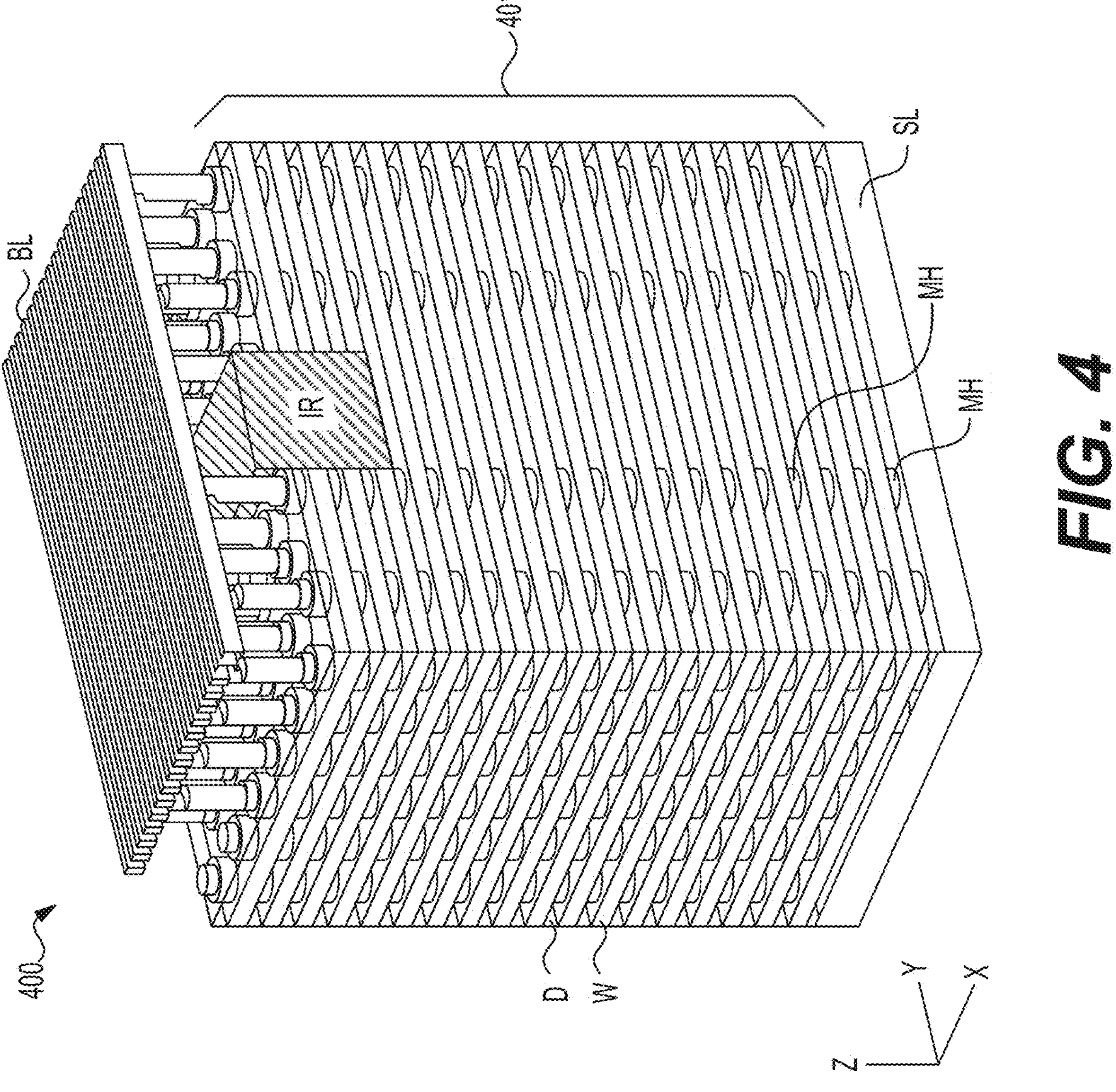
FIG. 4 is a perspective view of a portion of one embodiment of a monolithic three dimensional memory structure according to aspects of the disclosure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figures 5A, 5B:
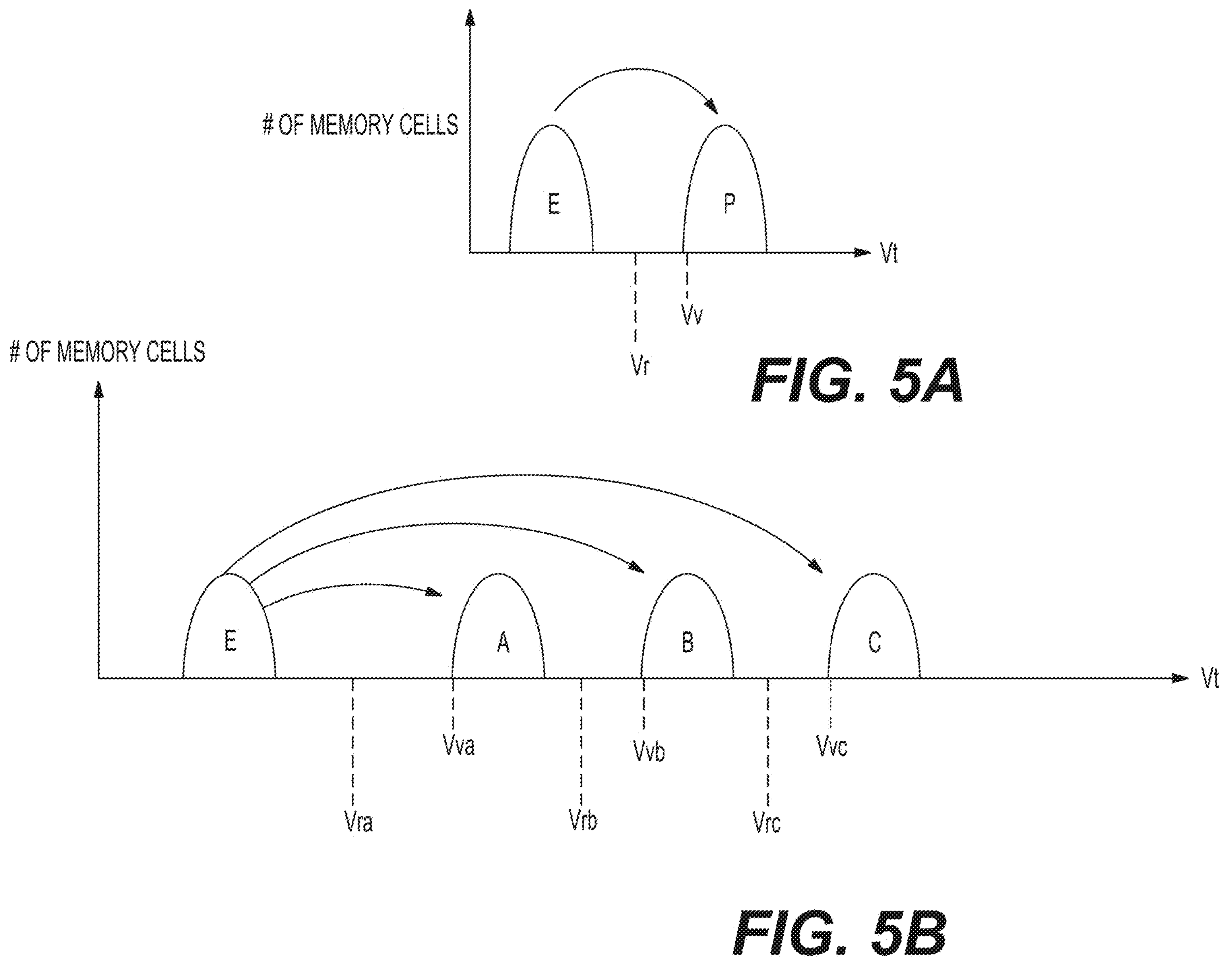
FIGS. 5A-5F depict examples of threshold voltage distributions according to aspects of the disclosure.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bits per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

| | E | A | B | C |
|---|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figures 5C, 5D:
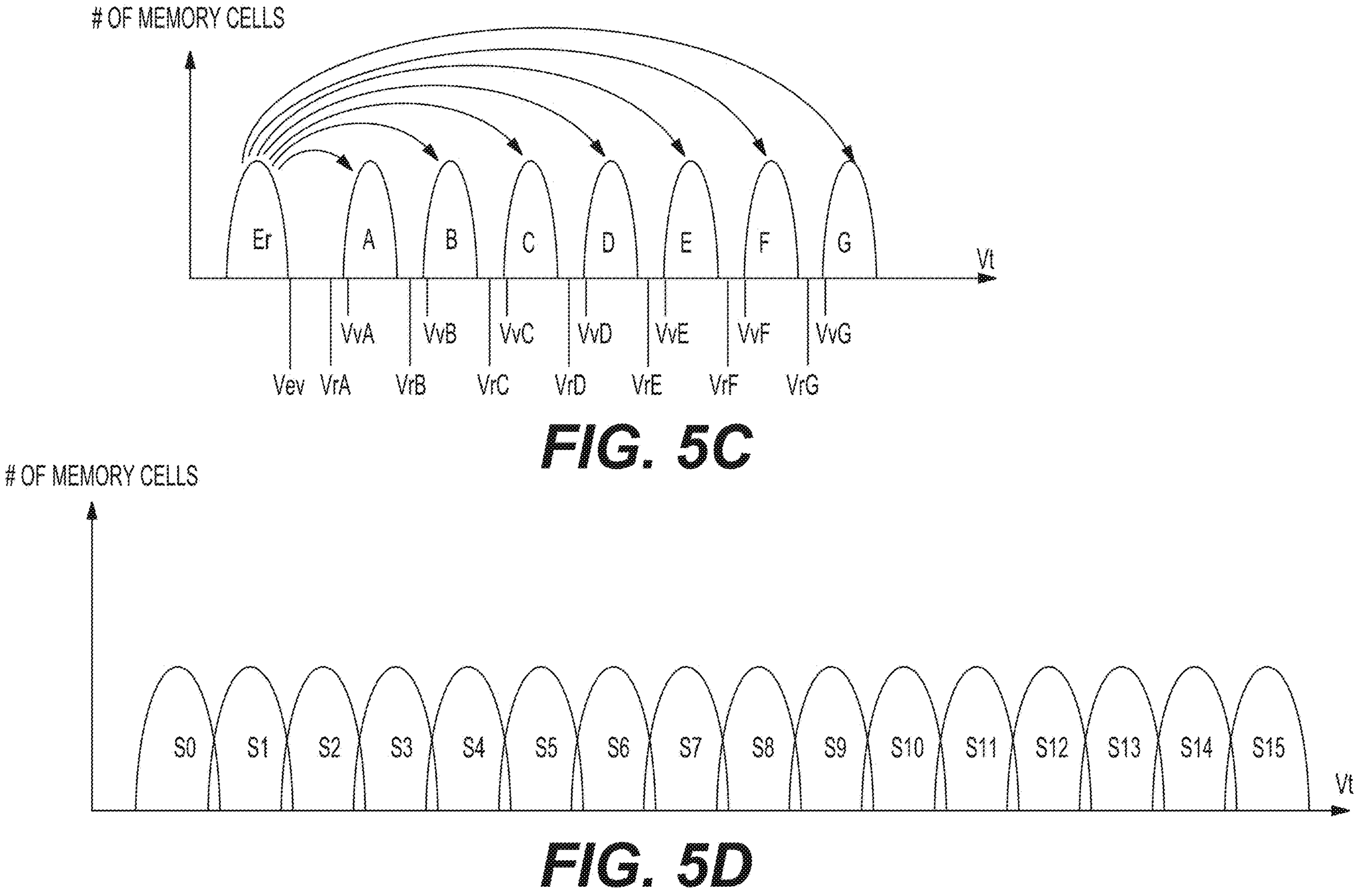

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

| | Er | A | B | C | D | E | F | G |
|---|---|---|---|---|---|---|---|---|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 5C) or verify operation (e.g. see verify target levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figures 5E, 5F:
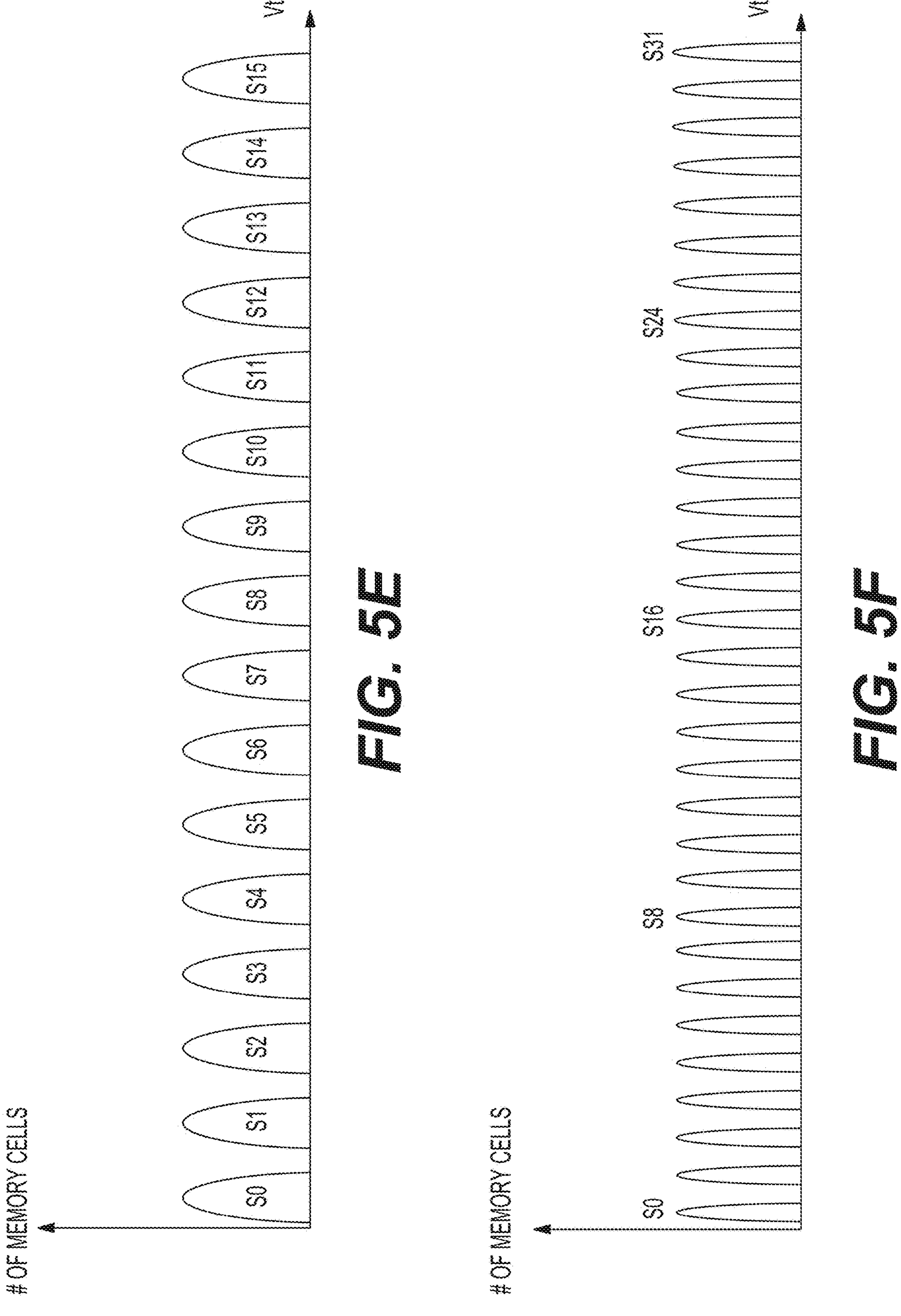

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 1 | 1 | 1 | 1 | 0 | 0 | 0 | 0 | 0 | 1 | 1 | 0 | 0 | 0 | 1 |
| UP | 1 | 1 | 0 | 0 | 0 | 0 | 0 | 0 | 1 | 1 | 1 | 1 | 1 | 1 | 0 | 0 |
| MP | 1 | 1 | 1 | 0 | 0 | 0 | 0 | 1 | 1 | 0 | 0 | 0 | 0 | 1 | 1 | 1 |
| LP | 1 | 0 | 0 | 0 | 1 | 1 | 0 | 0 | 0 | 0 | 0 | 1 | 1 | 1 | 1 | 1 |

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
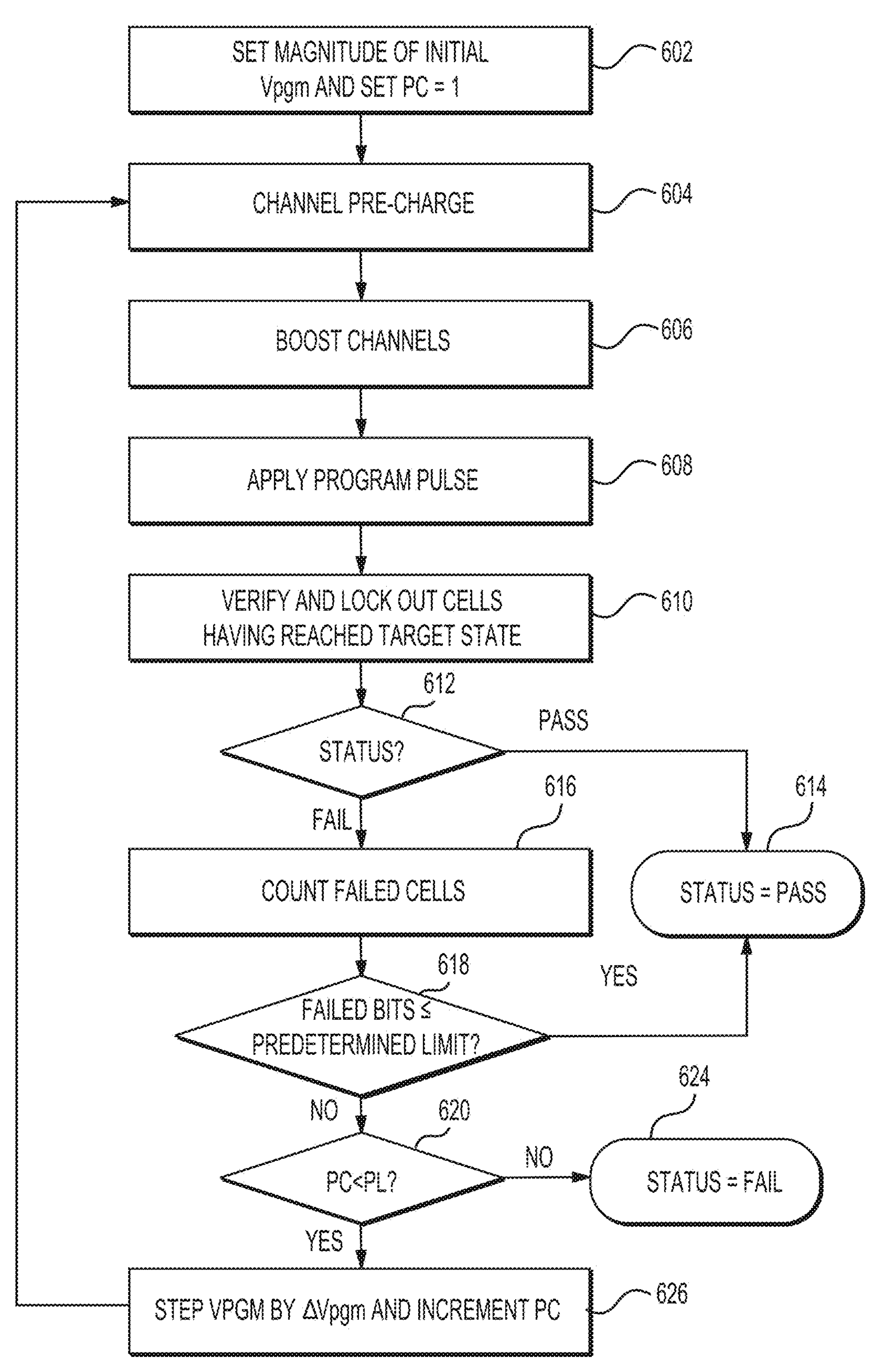
FIG. 6 is a flow chart describing one embodiment of a process for programming non-volatile memory according to aspects of the disclosure.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the program counter PC is incremented by 1 and the programming voltage signal Vpgm is stepped up to the next magnitude. For example, the next pulse will have a magnitude greater than the previous pulse by a step size $\Delta$Vpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

In some embodiments, the controller, control die or memory die perform the ECC decoding process (see ECC engine). To help fix errors that can occur when storing data, error correction is used. During the programming process, ECC engine encodes the data to add ECC information. For example, ECC engine is used to create code words. In one embodiment, data is programmed in units of pages. Because it is possible that errors can occur when programming or reading, and errors can occur while storing data (e.g., due to electrons drifting, data retention issues or other phenomenon), error correction is used with the programming of a page of data. Many error correction coding schemes are well known in the art. These conventional error correction codes (ECC) are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word. In other embodiments, the actual data is changed.

The particular parameters for a given error correction code include the type of code, the size of the block of actual data from which the code word is derived, and the overall length of the code word after encoding. For example, a typical BCH code applied to 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the controller receives host data, also referred to as information bits, that is to be stored in a memory structure. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in memory structure 326 by programming one or more memory cells to one or more programming states, which corresponds to v.

In one possible implementation, an iterative probabilistic decoding process is used which implements error correction decoding corresponding to the encoding implemented in controller 120. Further details regarding iterative probabilistic decoding can be found in the above-mentioned D. MacKay text. The iterative probabilistic decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios, LLRs, which are obtained from LLR tables. LLR values are measures of the reliability with which the values of various binary bits read from the storage elements are known.

The LLR for a bit is given by:

$$Q = \log 2 \, P(v = 0 \mid Y) P(v = 1 \mid Y),$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

The controller receives the code word Y1 and the LLRs and iterates in successive iterations in which it determines if parity checks (equations) of the error encoding process have been satisfied. If all parity checks have been satisfied, the decoding process has converged and the code word has been error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

Figure 7:
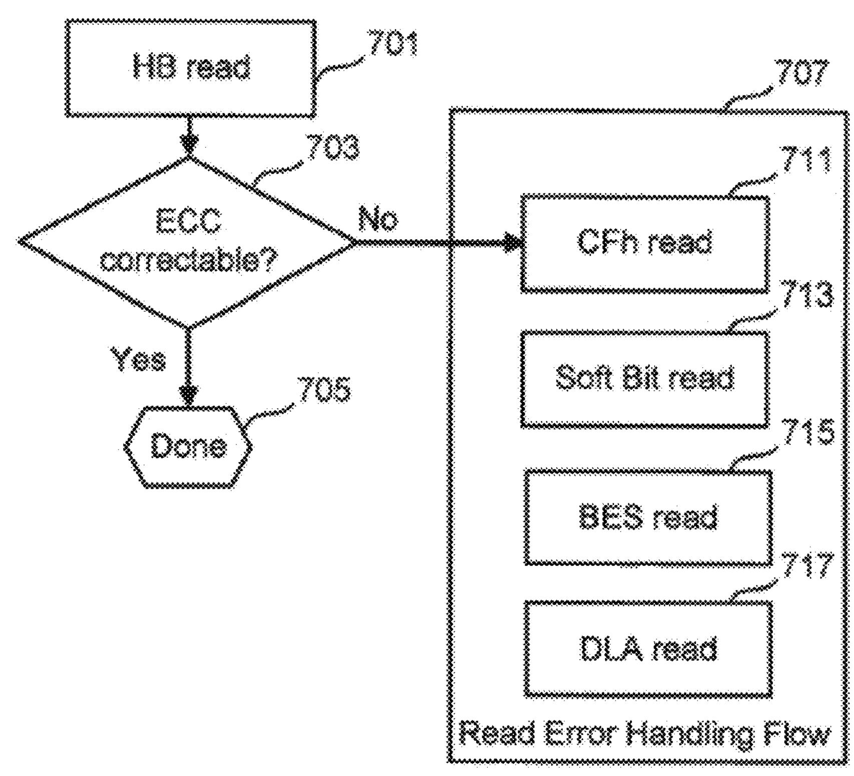
FIG. 7 illustrates the overlap of the distribution of two adjacent data states and a set of read values that can be used to determine the data state of a cell and the reliability of such a read according to aspects of the disclosure.
Figure 8:
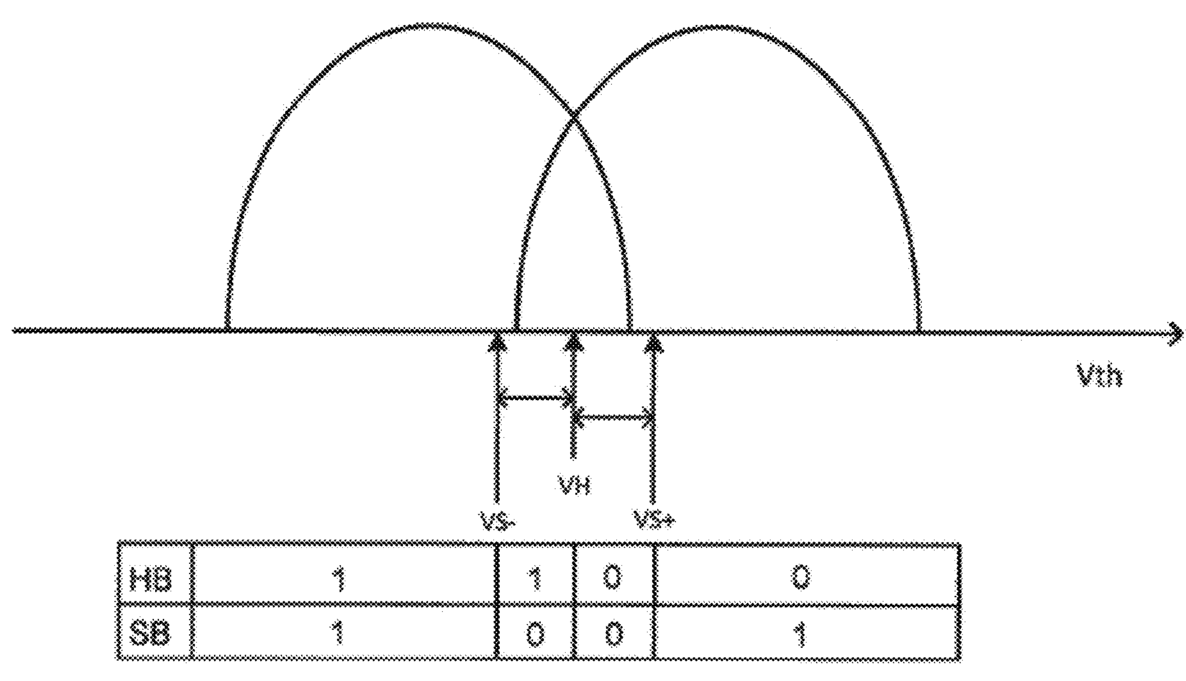
FIG. 8 illustrates the concept of hard bits and soft bits according to aspects of the disclosure.

FIG. 7 illustrates a conventional read flow that incorporates ECC correction and read error handling. Step 701 is a read of the data stored in the memory cells to determine a "hard bit" (HB), where the hard bit values corresponds to a standard read using the values Vri of FIG. 5A-5C used to differentiate the different states if they were well defined, separated distributions as in FIGS. 5A-5C. Step 703 determines whether the read data is correctable using ECC techniques and, if so, the read process is done at step 705. When the hard bit data becomes uncorrectable by the ECC in step 703, at step 707 a read error handling flow can be invoked, where this can involve various read type to recover read data. Examples of the read types that, depending on the embodiment, can be used to recover the data content are: "CFh read" 711, which is a re-read of the hard bit, but which allows for a longer settling time for bias levels such as the selected word line's voltage; a "soft bit" read 713 that provides information on the reliability of the hard bit value; a "BES read" 715 that tries shifting the hard bit read levels in order to extract the data; and "DLA read" 717 that considers the effects of neighboring word lines on the read-selected word line. One or more of these can be combined, either in various sequences or combinations, to try and extract the data content in the event the basic ECC process fails. For any of the embodiments, once read error handling flow 707 is invoked as step 703, performance is degraded, often severely. The following considers techniques to use soft bit data while reducing its impact on memory performance. FIG. 8 consider the use of soft bits in more detail.

FIG. 8 can be used to illustrate the concept of hard bits and soft bits. FIG. 8 illustrates the overlap of the distribution of two adjacent data states and a set of read values that can be used to determine the data state of a cell and the reliability of such a read, with the corresponding hard bit and soft bits shown in the table underneath for one particular encoding of values. The read value VH is an initial data state value, or hard read, value used to determine a hard bit (HB) value and corresponds to the values Vri of FIG. 5A, 5B, or 5C used to differentiate the different states if they were well defined, separated distributions as in FIGS. 5A-5C. The additional read levels of VS+, margined somewhat above VH, and VS−, margined somewhat below VH, are "soft read" values and can be used to provide "soft bit" (SB) values. The soft bit values give information on the quality or reliability of the initial data state value, or hard bit, data, as the soft bit data provide information on the degree to which the distributions have spread. Some embodiments of ECC codes, such as low density parity codes (LDPC), can use both the hard bit and the soft bit data in order to increase their capability. Although FIG. 8 shows only the pair of soft bit read values, other embodiments can use additional margined read valued to generate more soft bit values for a given hard bit if higher resolution is desired. More generally, the hard bit corresponds to the presumed data value based on a sensing operation and the soft information, which can be a single binary soft bit, multiple soft bits or a decimal/fractional value, indicates the reliability or trustworthiness of the hard bit value. When used in ECC methods that use soft information, the soft information can be treated as the probability that a corresponding hard bit value is correct.

During a read operation, if VH is below the memory cells threshold value, the memory cell will be non-conducting and the read data value (HB) will read as "0". If a memory cell is within the central region of either distribution of FIG. 8, a read at VS+ and VS− will provide the same result; if these reads differ, the memory cell's threshold voltage is between these values and could be from the tail region of either the distribution above or the distribution below, so that the HB data is unreliable. Reading at both these levels and XNORing the results gives an SB value of "1" if the data is deemed reliable and an SB value of "0" if unreliable.

For example, when both the SB+ and SB− read are "0", then:

$$SB = (SB+)\ XNOR\ (SB-) = \text{“0”}\ XNOR\ \text{“0”} = 1,$$

SB=1 and the HB read value will be treated as reliable. During a soft bit decode in ECC, this will result in memory cell in the upper distribution having HB="0" and SB="1", indicating a reliable correct bit (RCB), whereas a memory cell having a threshold voltage between SB+ and SB− will result in SB="0" to indicate that the HB value is unreliable.

FIGS. 9A and 9B respectively show the read levels for computing hard bit and soft bit values for the lower page of data in a three bits of data per memory cell embodiment using the encoding of Table 2 above, and where soft bit values of 1, 0 respectively indicate that the hard bit value is reliable, unreliable. FIG. 9A shows the threshold voltage distribution of memory cells in a 3-bit per cell, similar to that shown in FIG. 5C, but where the distributions are not as well defined and display some degree of overlap. The overlap of distributions can be from several causes, such as charge leakage or disturbs, where operations on one word line or bit line affect the data state stored on nearby memory cells. Additionally, in an actual write operation, the distributions will often not be as well-defined as shown in FIG. 5C since the writing of memory cells with such accuracy is adverse to performance, as a larger number of fine programming steps and some cells will be hard to program or program overly rapidly. Because this, programming algorithms typically allow for some degree of overlap, relying upon ECC to accurately extract the user data content.

The read points used to differentiate a lower page data value are represented as the broken vertical lines between the Er and A states and between the D and E states, along with the corresponding hard bit values written underneath. Due to the overlap of distributions, a number of memory cells that are storing Er or E data will incorrectly read as HB=0 and a number of memory cells that are storing A or D data will incorrectly read as HB=1. The optimal read values can be determined as part of device characterization and stored as fuse values for the control circuitry, for example. In some embodiments, the control circuit may shift these values to improve their accuracy as part of a standard read operation or as part of a read error handling flow 707 as a BES read 715.

To be able to handle higher amounts of error, stronger ECC can be used. However, this requires storing of more parity bits, reducing the proportion of memory cells available for user data, effectively reducing memory capacity. Additionally, performance is affected as more computations are involved to encode/decode the code words, and write and read the additional ECC data Further, more ECC data needs to be transferred to and from the ECC circuitry over the data bus structures.

FIG. 9B shows the soft bit values and the read points that can be used to determine the soft bit values corresponding to the lower page hard bit values of FIG. 9A. As shown, the soft bit values are determined based on a pair of reads are to either side of the basic hard bit read value. These soft bit read values can be based on offsets from the hard bit read values, either symmetric or asymmetric, and be stored as fuse values in a register determined as part of device characterization, for example. In other embodiments, they may be determined, or updated, dynamically. Although the use of soft bits at step 713 can be quite effective in extracting data content that is not extractable in step 703, it comes with a performance penalty as it needs to be invoked in response to an ECC fail at step 703, uses two additional reads for each hard bit read, requires the soft bit data to be transferred out after the additional reads, and additional computations need to be performed.

To improve upon this situation, an “efficient soft sense mode” my be used. In this sensing mode, a hard bit read and soft bit read can be combined into one sequence that uses two sensing levels for sensing time efficiency. By using efficient soft sense read as a default mode, the extra soft bit information can be provided for ECC correction with triggering a read error handling flow. Since only two sensing operations are used to generate both the hard bit and soft bit data, this technique avoids the tripling of sense time that results from a standard hard read plus soft read. Additionally, by merging the hard bit and soft bit sense into one sequence, much of the extra overhead involved in read sequence operations (e.g., enabling charge pumps, ramping up word lines, and so on) can be avoided. FIG. 10 illustrates the use of efficient soft sense mode.

FIG. 10 illustrates the assignment of hard bit and soft bit values, along with the read levels used in an embodiment for efficient soft sensing. FIG. 10 is similar to FIG. 8 and shows the memory cell Vth distribution for two data states that again have overlap in the central area. A hard bit read is again performed, but rather than trying to be placed at or near the center of the overlap region at a point optimized for distinguishing the two states, in this embodiment, the hard bit read is off-set to the lower Vth side so that any memory cell that reads at or below VH is reliably in the lower data state (illustrated here a “1” as in the example FIG. 8). It is also assigned a soft bit value of “0”, where, in contrast to the embodiment of FIG. 8, a SB=0 value now indicates a reliable HB value. If the memory cell reads above VH, its hard bit value corresponds to the higher Vth data state with HB=0. Rather than the two soft bit reads of FIG. 8, in the embodiment of FIG. 10, only a single soft bit read is performed as a VS value offset to the high Vth side. If the memory cell’s Vth is found to be above VS, it is assigned an HB value of HB=0 and considered reliable (HS=0). For a memory cell having a Vth found to be between VH and VS, the memory cell is assigned HB=0, but considered unreliable (SB=1). Note that in the embodiment of FIG. 10, only one of the two states is checked for soft bit data, so that only the HB=0 state may have either SB value, while the HB=1 memory cell will always have SB=0. Put another way, soft bit data is only determined on the one side (here the lower side, for HB=0) of the pair of overlapping distributions, and not on the other side (here the high side, for HB=1). In this embodiment, the single VS read is performed to the left (higher Vth) of the VH read, but in other embodiments the arrangement can be reversed.

Although the total amount of data generated in the embodiment of FIG. 10 is less than that of FIG. 8, the efficient soft sense mode of FIG. 10 will often be sufficient to extract the user data content without resort to further read error handling. As there are only two reads involved in the determinations of FIG. 10, sensing times are shorter, and can be reduced even further by doing both reads as single sensing operation. Additionally, less data is transferred to the ECC engine or engines: in FIG. 8, four combinations of (HB, SB) data result, while in FIG. 10 there are only three combinations, or 25% less data. The increased error toleration provided by efficient soft sensing can also improve write performance as data need not be programmed as accurately, allowed relaxed programming tolerances.

FIG. 11 illustrates the application of efficient soft sense mode to lower page data in a three bits of data per memory cell embodiment using the encoding of Table 2. FIG. 11 is similar to FIGS. 9A and 9B, but combines the HB and SB values into a single figure and uses the single SB read level for a given HB read level of an efficient soft sense, rather than a pair of SB reads for a given HB. For example, looking at the differentiation of the Er state from A state, for the left hand read, memory cells to the left are reliably a “1” for the lower page value, with (HB, SB)=(1,0), where again it is noted that in this encoding SB=0 indicates a reliable HB value and SB=1 indicates an unreliable HB value. For the right hand read for Er, A, a memory cell to the right indicates a memory cell that has a reliable lower page value of “0”, or (HB, SB)=(0,0). Memory cells with a Vth between the left and right read levels are assigned a lower page hard bit value of 0, but considered unreliable, so that (HB, SB)=(0,1). Similarly, for the reads to distinguish between the D and E states, memory cells to the left of the left read are reliably “0” ((HB, SB)=(0,0)), memory cells above the right read are reliable lower page “1” data ((HB, SB)=(1,0)), and memory cells between the two are assigned an unreliable lower page value of “1” ((HB, SB)=(1,1)).

As discussed above, challenges may arise when the memory cells of a hybrid SLC (hSLC) memory apparatus are first used, for example, as triple-level cell (TLC)/quad-level cell (QLC) and later as SLC. FIG. 12 shows an example sequence of usage of memory cells in a hybrid SLC memory apparatus and illustrates possible issues when the memory cells are first used as triple-level cell (TLC)/quad-level cell (QLC) before being used as SLC. As shown, hSLC usage results in the situation where a defect is created during TLC/QLC, but such a defect causes a failure during SLC first. In many memory apparatuses, SLC programming is done with one pulse, zero verify (1P0V), most of these failures pass erase and then fail during a read first. Since SLC may not have full block recovery, the defect parts per million (DPPM) in hSLC is much higher than pure SLC usage. High DPPM in hSLC becomes the bottleneck in reaching a desired final DPPM spec of the memory apparatus.

Consequently, described herein is a memory apparatus (e.g., storage system 100 of FIG. 1, memory die 200 of FIG. 2A) including memory cells (e.g., memory cells comprising memory structure 202 of FIG. 2B or non-volatile memory 130). The memory cells are configured to retain a threshold voltage Vt or Vth corresponding to one of a plurality of memory or data states (e.g., FIGS. 5A-5F). The memory cells are grouped into blocks (e.g., FIG. 4 shows a portion 400 of one block of memory). The memory cells are operable as one of single-level cells storing one bit of data per each of the memory cells (e.g., having a threshold voltage distribution of FIG. 5A) or multi-level cells storing a plurality of bits of the data per each of the memory cells (e.g., having a threshold voltage distribution of FIGS. 5B-5F). The memory apparatus also includes a control circuit or means (e.g., one or any combination of memory control 120 of FIG. 1, control circuitry 210, 220, system control logic 260, of FIG. 2A, processor 330 of FIG. 3, and so forth). The control means is configured to determine whether the memory cells of one of the blocks were previously used as the multi-level cells. The control means is also configured to determine the memory cells of the one of the blocks should be used as the multi-level cells only in response to determining the memory cells of one of the blocks were previously used as the multi-level cells and an occurrence of at least one failure to decode the data of the memory cells of the one of the blocks.

In more detail and according to an aspect, as part of a first step or "step 1", the control means is further configured to receive a request for a program operation from a host. The control means is additionally configured to perform a block type check operation in response to receiving the request for the program operation from the host. In addition, the control means is configured to determine whether the memory cells of one of the blocks were previously used as the multi-level cells and whether a next usage of the memory cells of one of the blocks is as single-level cells. The control means perform a next regular operation in response to determining the memory cells of one of the blocks were not previously used as the multi-level cells or the next usage of the memory cells of one of the blocks is not as the single-level cells. The control means is also configured to check the occurrence of at least one failure to decode the data of the memory cells of the one of the blocks in a read error handling operation in response to determining the memory cells of one of the blocks were previously used as the multi-level cells and the next usage of the memory cells of one of the blocks is as the single-level cells.

There are two possible options for the block type check. A first option for the block type check is a block type detection utilizing a count of a number of cells discussed in more detail below. Alternatively, the control means may track a flag for each block for previous program erase cycle block type. For the block type detection utilizing the count of the number of cells, a read is done to find out previous usage block type (TLC/QLC or SLC). So according to an aspect, the control means is further configured to read a group of the memory cells of one of the blocks in the block type check operation at a predetermined block type check read level. The control means counts a block type check quantity of the memory cells having the threshold voltage greater than the predetermined block type check read level. The control means is then configured to determine whether the block type check quantity is approximately equal to a predetermined block type check threshold. The predetermined block type check threshold can be a quantity of programmed bits equaling a total number of bits in the page divided by two, however, it should be understood that other predetermined block type check thresholds are contemplated. The control means is further configured to determine the memory cells of one of the blocks were previously used as the multi-level cells in response to the determining the block type check quantity is not approximately equal to the predetermined block type check threshold. The control means is also configured to determine the memory cells of one of the blocks were not previously used as the multi-level cells in response to the determining the block type check quantity is approximately equal to the predetermined block type check threshold.

Thus, such a special read can be done to identify previous usage block type. Reading 0 bit counts for TLC and QLC blocks may be due to multiple read disturb (RD) stress or data retention (DR) stress and cause an imbalance in bit count. This can be managed by adding a margin for error, such as +/−5% of total number of bits in the page divided by two. Nevertheless, it should be understood that other margins for error may be used. So, when the block is programmed as random SLC, approximately 50% of the memory cells are in Er state. When the block is programmed as random TLC, approximately $\frac{1}{8}^{th}$=12.5% of cells are in Er state. When the block is programmed as random QLC, approximately $\frac{1}{16}^{th}$=6.25% of cells are in Er state. So, for TLC, when the control means checks for number of cells in erase (Er) state, the DR or RD or any other mechanism will not cause the cells in Er state to go from 12.5% to 50%. Thus, if the predetermined block type check threshold of close to 50% cells in Er state, SLC or TLC/QLC can be determined.

As discussed, the data of one of the blocks can be stored in one of a plurality of pages. So, according to further aspects of the disclosure, the group is one of the pages and the predetermined block type check threshold is approximately a total quantity of bits of the data in one of the plurality of pages divided by two. As discussed above and with reference back to FIG. 5A, for example, the plurality of data states for the memory cells operating as the single-level cells includes, in order of increasing threshold voltage, an erase state and a programmed state. Similarly, as discussed and with reference back to FIGS. 5B-5F, the plurality of data states for the memory cells operating as the multi-level cells includes, in order of increasing threshold voltage, the erase state and a plurality of programmed data states (e.g., A, B, C, D, E, F and G data states of FIG. 5C or S0, S1, S2, S3, S4, S5, S6, S7, S8, S9, S10, S11, S12, S13, S14 and S15 data states of FIGS. 5D and 5E). So, the predetermined block type check read level is one of a single-level memory cell read level (e.g., Vv of FIG. 5A) or a first programmed data state read level associated with a first one of the plurality of programmed data states (e.g., VvA of FIG. 5C).

As discussed above, the memory apparatus can further include an error correcting code or ECC engine (e.g., ECC engine 158 of FIG. 1) configured to decode the data read from the memory cells to detect errors. So, according to an aspect, as part of a second step or "step 2", the control means is further configured to determine whether deep read error handling associated with the occurrence of at least one failure to decode the data is triggered in the read error handling operation for the one of the blocks in response to determining the memory cells of one of the blocks were previously used as the multi-level cells and the next usage of the memory cells of one of the blocks is as the single-level cells. In addition, the control means is configured to perform the next regular operation in response to determining the deep read error handling associated with the occurrence of at least one failure to decode the data is not triggered in the read error handling operation for the one of the blocks. The control means is further configured to mark the one of the blocks as having a first read error handling strike and set a counter to one in response to determining the deep read error handling associated with the occurrence of at least one failure to decode the data is triggered in the read error handling operation for the one of the blocks. The control means is additionally configured to determine whether the deep read error handling is triggered again in the read error handling operation for the one of the blocks. The control means determines the memory cells of the one of the blocks should be used as the multi-level cells only in response to determining the deep read error handling is not triggered again in the read error handling operation for the one of the blocks. The control means is also configured to mark the one of the blocks as a bad block and do not use the memory cells of the one of the blocks in response to determining the deep read error handling is triggered again in the read error handling operation for the one of the blocks.

According to an aspect, the control means, as part of an "XOR two strike rule check", is further configured to read the data from the memory cells of the one of the blocks in a first read operation. The control means decodes the data read from the memory cells of the one of the blocks in the first read operation. The control means is additionally configured to trigger the read error handling operation and perform additional soft bit reads (e.g., as discussed above) in response to a failure to decode the data read from the memory cells of the one of the blocks in the first read operation. Furthermore, the control means is configured to logically exclusive or the data read from the memory cells of the one of the blocks in the first read operation and the data of the memory cells of the one of the blocks being read in the first read operation and determine the deep read error handling is triggered. In addition, the control means is configured to read the data from the memory cells of the one of the blocks in a second read operation. The control means is further configured to decode the data read from the memory cells of the one of the blocks in the second read operation. The control means is additionally configured to trigger the read error handling operation and perform the additional soft bit reads in response to a failure to decode the data read from the memory cells of the one of the blocks in the second read operation. The control means is also configured to logically exclusive or the data read from the memory cells of the one of the blocks in the second read operation and the data of the memory cells of the one of the blocks being read in the second read operation and determine the deep read error handling is triggered again.

Thus, if a previous usage of a block is as multi-level cells and this block needs to be used as single-level cells, then the control means performs the XOR two strike rule check to determine if the block should be used as hSLC or always multi-level. More specifically, upon every read on from the NAND, the ECC engine will try decoding the data. If the decode fails, then read error handling (REH) is triggered in the system. As a part of REH handling, the control means does BES+soft bit reads, as discussed above, to pass the decode. If REH is still not able pass the decode, then XOR gets triggered. Now, system will mark that this particular block has done XOR once. Later, if the same block needs XOR in another program erase cycle then system marks this block for triggering XOR twice (i.e., across different program erase cycle) and makes it as a grown bad block. Because the control means just checks if the block has gone through the deep REH in a cycle. Control means for memory apparatuses already tracking such read error handling operations (e.g., recording a flag to indicate if a block has gone through XOR/Deep REH) can, for example, just check that flag. If it is set, then the block is not used as an hSLC block. Thus, the performance penalty in such memory apparatuses is not big because the control means is just checking if the XOR was triggered.

As discussed, the memory cells operating as multi-level cells can store three bits or four bits of the data per each of the memory cells and are triple-level cells (TLC) or four-level cells (QLC). Memory apparatuses with QLC or TLC memory cells can have same number of word lines and strings (i.e., sub-blocks). So, if a failure happens for one mechanism in QLC then similar mechanism can cause such a failure on TLC as well.

FIGS. 13-15 illustrate steps of a method of operating a memory apparatus (e.g., storage system 100 of FIG. 1, memory die 200 of FIG. 2A) including memory cells (e.g., memory cells comprising memory structure 202 of FIG. 2B or non-volatile memory 130). As discussed, the memory cells are configured to retain a threshold voltage Vt or Vth corresponding to one of a plurality of memory or data states (e.g., FIGS. 5A-5F). The memory cells are grouped into blocks (e.g., FIG. 4 shows a portion 400 of one block of memory). The memory cells are operable as one of single-level cells storing one bit of data per each of the memory cells (e.g., having a threshold voltage distribution of FIG. 5A) or multi-level cells storing a plurality of bits of the data per each of the memory cells (e.g., having a threshold voltage distribution of FIGS. 5B-5F). Referring initially to FIG. 13 specifically, the method includes the step of 1300 determining whether the memory cells of one of the blocks were previously used as the multi-level cells. The method also includes the step of 1302 determining the memory cells of the one of the blocks should be used as the multi-level cells only in response to determining the memory cells of one of the blocks were previously used as the multi-level cells and an occurrence of at least one failure to decode the data of the memory cells of the one of the blocks.

According to an aspect and referring specifically to FIG. 14, as part of the first step or "step 1", the method further includes the step of 1400 receiving a request for a program operation from a host. The method continues by 1402 performing a block type check operation in response to receiving the request for the program operation from the host. The next step of the method is 1404 determining whether the memory cells of one of the blocks were previously used as the multi-level cells and whether a next usage of the memory cells of one of the blocks is as single-level cells. The method additionally includes the step of 1406 performing a next regular operation in response to determining the memory cells of one of the blocks were not previously used as the multi-level cells or the next usage of the memory cells of one of the blocks is not as the single-level cells. The method also includes the step of 1408 checking the occurrence of at least one failure to decode the data of the memory cells of the one of the blocks in a read error handling operation in response to determining the memory cells of one of the blocks were previously used as the multi-level cells and the next usage of the memory cells of one of the blocks is as the single-level cells.

As discussed above, there are two possible options for the block type check. The first option for the block type check is the block type detection utilizing a count of a number of cells discussed above as well as in more detail below. On the other hand, the memory apparatus may track a flag for each block for previous program erase cycle block type. For the block type detection utilizing the count of the number of cells, a read is done to find out previous usage block type (TLC/QLC or SLC). Thus, according to an aspect and referring specifically to FIG. 15, the method further includes the step of 1500 reading a group of the memory cells of one of the blocks in the block type check operation at a predetermined block type check read level. The method additionally includes the step of 1502 counting a block type check quantity of the memory cells having the threshold voltage greater than the predetermined block type check read level. Next, 1504 determining whether the block type check quantity is approximately equal to a predetermined block type check threshold. The method proceeds with the step of 1506 determining the memory cells of one of the blocks were previously used as the multi-level cells in response to the determining the block type check quantity is not approximately equal to the predetermined block type check threshold. The method also includes the step of 1508 determining the memory cells of one of the blocks were not previously used as the multi-level cells in response to the determining the block type check quantity is approximately equal to the predetermined block type check threshold.

Again, as discussed, the data of one of the blocks can be stored in one of a plurality of pages. So, according to further aspects of the disclosure, the group is one of the pages and the predetermined block type check threshold is approximately a total quantity of bits of the data in one of the plurality of pages divided by two. As discussed and again referring back to FIG. 5A, for example, the plurality of data states for the memory cells operating as the single-level cells includes, in order of increasing threshold voltage, an erase state and a programmed state. Also, as discussed and again referring back to FIGS. 5B-5F, the plurality of data states for the memory cells operating as the multi-level cells includes, in order of increasing threshold voltage, the erase state and a plurality of programmed data states (e.g., A, B, C, D, E, F and G data states of FIG. 5C or S0, S1, S2, S3, S4, S5, S6, S7, S8, S9, S10, S11, S12, S13, S14 and S15 data states of FIGS. 5D and 5E). Thus, the predetermined block type check read level is one of a single-level memory cell read level (e.g., Vv of FIG. 5A) or a first programmed data state read level associated with a first one of the plurality of programmed data states (e.g., VvA of FIG. 5C).

Once again, the memory apparatus can further include an error correcting code or ECC engine (e.g., ECC engine 158 of FIG. 1) configured to decode the data read from the memory cells to detect errors. So, according to an aspect and referring back to FIG. 14, as part of a second step or "step 2", the method further includes the step of 1410 determining whether deep read error handling associated with the occurrence of at least one failure to decode the data is triggered in the read error handling operation for the one of the blocks in response to determining the memory cells of one of the blocks were previously used as the multi-level cells and the next usage of the memory cells of one of the blocks is as the single-level cells. The method continues with the step of 1412 performing the next regular operation in response to determining the deep read error handling associated with the occurrence of at least one failure to decode the data is not triggered in the read error handling operation for the one of the blocks. In addition, the method includes the step of 1414 marking the one of the blocks as having a first read error handling strike and setting a counter to one in response to determining the deep read error handling associated with the occurrence of at least one failure to decode the data is triggered in the read error handling operation for the one of the blocks. The method proceeds by 1416 determining whether the deep read error handling is triggered again in the read error handling operation for the one of the blocks. The method additionally includes the step of 1418 determining the memory cells of the one of the blocks should be used as the multi-level cells only in response to determining the deep read error handling is not triggered again in the read error handling operation for the one of the blocks. The method also includes the step of 1420 marking the one of the blocks as a bad block (GBB) and do not use the memory cells of the one of the blocks in response to determining the deep read error handling is triggered again in the read error handling operation for the one of the blocks.

According to an aspect, the method, as part of the "XOR two strike rule check", further includes the step of reading the data from the memory cells of the one of the blocks in a first read operation. Next, decoding the data read from the memory cells of the one of the blocks in the first read operation. The method continues with the step of triggering the read error handling operation and perform additional soft bit reads in response to a failure to decode the data read from the memory cells of the one of the blocks in the first read operation. In addition, the method includes the step of logically exclusive oring the data read from the memory cells of the one of the blocks in the first read operation and the data of the memory cells of the one of the blocks being read in the first read operation and determining the deep read error handling is triggered. The method proceeds by reading the data from the memory cells of the one of the blocks in a second read operation. Next, decoding the data read from the memory cells of the one of the blocks in the second read operation. The method additionally includes the step of triggering the read error handling operation and perform the additional soft bit reads in response to a failure to decode the data read from the memory cells of the one of the blocks in the second read operation. The method also includes the step of logically exclusive oring the data read from the memory cells of the one of the blocks in the second read operation and the data of the memory cells of the one of the blocks being read in the second read operation and determining the deep read error handling is triggered again.

Again, the memory cells operating as multi-level cells can store three bits or four bits of the data per each of the memory cells and are triple-level cells (TLC) or four-level cells (QLC).

The memory apparatus and method of operation disclosed herein provide numerous advantages including a significant reduction in uncorrectable grown bad block (UCGBB) and improve DPPM. There is a test time reduction by catching the blocks on the fly without any data loss situation. It is possible to apply for both TLC and QLC. Also, the block type check will take ~50 us (35 us for SLC read and ~15 us for data transfer) so there is very minimal performance penalty.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

What is claimed is:

1. A memory apparatus, comprising:
- memory cells configured to retain a threshold voltage corresponding to one of a plurality of data states, the memory cells grouped into blocks and operable as one of single-level cells storing one bit of data per each of the memory cells or multi-level cells storing a plurality of bits of the data per each of the memory cells; and
- a control means configured to:
  - determine whether the memory cells of one of the blocks were previously used as the multi-level cells, and
  - in response to determining the memory cells of one of the blocks were previously used as the multi-level cells and an occurrence of at least one failure to decode the data of the memory cells of the one of the blocks, determine a next usage of the memory cells of the one of the blocks as the multi-level cells only.

2. The memory apparatus as set forth in claim 1, wherein the control means is further configured to:
- receive a request for a program operation from a host;
- perform a block type check operation in response to receiving the request for the program operation from the host;
- determine whether the memory cells of one of the blocks were previously used as the multi-level cells and whether the next usage of the memory cells of one of the blocks is as single-level cells;
- perform a next regular operation in response to determining the memory cells of one of the blocks were not previously used as the multi-level cells or the next usage of the memory cells of one of the blocks is not as the single-level cells; and
- check the occurrence of at least one failure to decode the data of the memory cells of the one of the blocks in a read error handling operation in response to determining the memory cells of one of the blocks were previously used as the multi-level cells and the next usage of the memory cells of one of the blocks is as the single-level cells.

3. The memory apparatus as set forth in claim 2, wherein the control means is further configured to:
- read a group of the memory cells of one of the blocks in the block type check operation at a predetermined block type check read level;
- count a block type check quantity of the memory cells having the threshold voltage greater than the predetermined block type check read level;
- determine whether the block type check quantity is approximately equal to a predetermined block type check threshold;
- determine the memory cells of one of the blocks were previously used as the multi-level cells in response to the determining the block type check quantity is not approximately equal to the predetermined block type check threshold; and
- determine the memory cells of one of the blocks were not previously used as the multi-level cells in response to the determining the block type check quantity is approximately equal to the predetermined block type check threshold.

4. The memory apparatus as set forth in claim 3, wherein the data of one of the blocks is stored in one of a plurality of pages and the predetermined block type check threshold is approximately a total quantity of bits of the data in one of the plurality of pages divided by two, the group is the one of the pages, the plurality of data states for the memory cells operating as the single-level cells includes, in order of increasing threshold voltage, an erase state and a programmed state, the plurality of data states for the memory cells operating as the multi-level cells includes, in order of increasing threshold voltage, the erase state and a plurality of programmed data states, and the predetermined block type check read level is one of a single-level memory cell read level or a first programmed data state read level associated with a first one of the plurality of programmed data states.

5. The memory apparatus as set forth in claim 2, further including an error correcting code engine configured to decode the data read from the memory cells to detect errors and wherein the control means is further configured to:
- determine whether deep read error handling associated with the occurrence of at least one failure to decode the data is triggered in the read error handling operation for the one of the blocks in response to determining the memory cells of one of the blocks were previously used as the multi-level cells and the next usage of the memory cells of one of the blocks is as the single-level cells;
- perform the next regular operation in response to determining the deep read error handling associated with the occurrence of at least one failure to decode the data is not triggered in the read error handling operation for the one of the blocks;
- mark the one of the blocks as having a first read error handling strike and set a counter to one in response to determining the deep read error handling associated with the occurrence of at least one failure to decode the data is triggered in the read error handling operation for the one of the blocks;
- determine whether the deep read error handling is triggered again in the read error handling operation for the one of the blocks;
- determine the memory cells of the one of the blocks should be used as the multi-level cells only in response to determining the deep read error handling is not triggered again in the read error handling operation for the one of the blocks; and
- mark the one of the blocks as a bad block and do not use the memory cells of the one of the blocks in response to determining the deep read error handling is triggered again in the read error handling operation for the one of the blocks.

6. The memory apparatus as set forth in claim 5, wherein the control means is further configured to:
- read the data from the memory cells of the one of the blocks in a first read operation;
- decode the data read from the memory cells of the one of the blocks in the first read operation;
- trigger the read error handling operation and perform additional soft bit reads in response to a failure to decode the data read from the memory cells of the one of the blocks in the first read operation;

logically exclusive or the data read from the memory cells of the one of the blocks in the first read operation and the data of the memory cells of the one of the blocks being read in the first read operation and determine the deep read error handling is triggered;

read the data from the memory cells of the one of the blocks in a second read operation;

decode the data read from the memory cells of the one of the blocks in the second read operation;

trigger the read error handling operation and perform the additional soft bit reads in response to a failure to decode the data read from the memory cells of the one of the blocks in the second read operation; and logically exclusive or the data read from the memory cells of the one of the blocks in the second read operation and the data of the memory cells of the one of the blocks being read in the second read operation and determine the deep read error handling is triggered again.

7. The memory apparatus as set forth in claim 1, wherein the memory cells operating as the multi-level cells store three bits or four bits of the data per each of the memory cells and are triple-level cells or four-level cells.

8. A controller in communication with a memory apparatus including memory cells configured to retain a threshold voltage corresponding to one of a plurality of data states, the memory cells grouped into blocks and operable as one of single-level cells storing one bit of data per each of the memory cells or multi-level cells storing a plurality of bits of the data per each of the memory cells, the controller configured to:

instruct the memory apparatus to determine whether the memory cells of one of the blocks were previously used as the multi-level cells; and in response to determining the memory cells of one of the blocks were previously used as the multi-level cells and an occurrence of at least one failure to decode the data of the memory cells of the one of the blocks, determine a next usage of the memory cells of the one of the blocks as the multi-level cells only.

9. The controller as set forth in claim 8, wherein the controller is further configured to:

receive a request for a program operation from a host;

instruct the memory apparatus to perform a block type check operation in response to receiving the request for the program operation from the host;

instruct the memory apparatus to determine whether the memory cells of one of the blocks were previously used as the multi-level cells and whether the next usage of the memory cells of one of the blocks is as single-level cells;

instruct the memory apparatus to perform a next regular operation in response to determining the memory cells of one of the blocks were not previously used as the multi-level cells or the next usage of the memory cells of one of the blocks is not as the single-level cells; and check the occurrence of at least one failure to decode the data of the memory cells of the one of the blocks in a read error handling operation in response to determining the memory cells of one of the blocks were previously used as the multi-level cells and the next usage of the memory cells of one of the blocks is as the single-level cells.

10. The controller as set forth in claim 9, wherein the controller is further configured to:

instruct the memory apparatus to read a group of the memory cells of one of the blocks in the block type check operation at a predetermined block type check read level;

count a block type check quantity of the memory cells having the threshold voltage greater than the predetermined block type check read level;

determine whether the block type check quantity is approximately equal to a predetermined block type check threshold;

determine the memory cells of one of the blocks were previously used as the multi-level cells in response to the determining the block type check quantity is not approximately equal to the predetermined block type check threshold; and determine the memory cells of one of the blocks were not previously used as the multi-level cells in response to the determining the block type check quantity is approximately equal to the predetermined block type check threshold.

11. The controller as set forth in claim 10, wherein the data of one of the blocks is stored in one of a plurality of pages and the predetermined block type check threshold is approximately a total quantity of bits of the data in one of the plurality of pages divided by two, the group is the one of the pages, the plurality of data states for the memory cells operating as the single-level cells includes, in order of increasing threshold voltage, an erase state and a programmed state, the plurality of data states for the memory cells operating as the multi-level cells includes, in order of increasing threshold voltage, the erase state and a plurality of programmed data states, and the predetermined block type check read level is one of a single-level memory cell read level or a first programmed data state read level associated with a first one of the plurality of programmed data states.

12. The controller as set forth in claim 9, wherein the memory apparatus further includes an error correcting code engine configured to decode the data read from the memory cells to detect errors and the controller is further configured to:

determine whether deep read error handling associated with the occurrence of at least one failure to decode the data is triggered in the read error handling operation for the one of the blocks in response to determining the memory cells of one of the blocks were previously used as the multi-level cells and the next usage of the memory cells of one of the blocks is as the single-level cells;

instruct the memory apparatus to perform the next regular operation in response to determining the deep read error handling associated with the occurrence of at least one failure to decode the data is not triggered in the read error handling operation for the one of the blocks;

mark the one of the blocks as having a first read error handling strike and set a counter to one in response to determining the deep read error handling associated with the occurrence of at least one failure to decode the data is triggered in the read error handling operation for the one of the blocks;

determine whether the deep read error handling is triggered again in the read error handling operation for the one of the blocks;

determine the memory cells of the one of the blocks should be used as the multi-level cells only in response to determining the deep read error handling is not triggered again in the read error handling operation for the one of the blocks; and mark the one of the blocks as a bad block and do not use the memory cells of the one of the blocks in response to determining the deep read error handling is triggered again in the read error handling operation for the one of the blocks.

13. The controller as set forth in claim 12, wherein the controller is further configured to:

instruct the memory apparatus to read the data from the memory cells of the one of the blocks in a first read operation;

instruct the memory apparatus to decode the data read from the memory cells of the one of the blocks in the first read operation;

instruct the memory apparatus to trigger the read error handling operation and perform additional soft bit reads in response to a failure to decode the data read from the memory cells of the one of the blocks in the first read operation;

logically exclusive or the data read from the memory cells of the one of the blocks in the first read operation and the data of the memory cells of the one of the blocks being read in the first read operation and determine the deep read error handling is triggered;

instruct the memory apparatus to read the data from the memory cells of the one of the blocks in a second read operation;

instruct the memory apparatus to decode the data read from the memory cells of the one of the blocks in the second read operation;

instruct the memory apparatus to trigger the read error handling operation and perform the additional soft bit reads in response to a failure to decode the data read from the memory cells of the one of the blocks in the second read operation; and logically exclusive or the data read from the memory cells of the one of the blocks in the second read operation and the data of the memory cells of the one of the blocks being read in the second read operation and determine the deep read error handling is triggered again.

14. A method of operating a memory apparatus including memory cells configured to retain a threshold voltage corresponding to one of a plurality of data states, the memory cells grouped into blocks and operable as one of single-level cells storing one bit of data per each of the memory cells or multi-level cells storing a plurality of bits of the data per each of the memory cells, the method comprising the steps of:

determining whether the memory cells of one of the blocks were previously used as the multi-level cells; and in response to determining the memory cells of one of the blocks were previously used as the multi-level cells and an occurrence of at least one failure to decode the data of the memory cells of the one of the blocks, determining a next usage of the memory cells of the one of the blocks as the multi-level cells only.

15. The method as set forth in claim 14, further including the steps of:

receiving a request for a program operation from a host;

performing a block type check operation in response to receiving the request for the program operation from the host;

determining whether the memory cells of one of the blocks were previously used as the multi-level cells and whether the next usage of the memory cells of one of the blocks is as single-level cells;

performing a next regular operation in response to determining the memory cells of one of the blocks were not previously used as the multi-level cells or the next usage of the memory cells of one of the blocks is not as the single-level cells; and checking the occurrence of at least one failure to decode the data of the memory cells of the one of the blocks in a read error handling operation in response to determining the memory cells of one of the blocks were previously used as the multi-level cells and the next usage of the memory cells of one of the blocks is as the single-level cells.

16. The method as set forth in claim 15, further including the steps of:

reading a group of the memory cells of one of the blocks in the block type check operation at a predetermined block type check read level;

counting a block type check quantity of the memory cells having the threshold voltage greater than the predetermined block type check read level;

determining whether the block type check quantity is approximately equal to a predetermined block type check threshold;

determining the memory cells of one of the blocks were previously used as the multi-level cells in response to the determining the block type check quantity is not approximately equal to the predetermined block type check threshold; and determining the memory cells of one of the blocks were not previously used as the multi-level cells in response to the determining the block type check quantity is approximately equal to the predetermined block type check threshold.

17. The method as set forth in claim 16, wherein the data of one of the blocks is stored in one of a plurality of pages and the predetermined block type check threshold is approximately a total quantity of bits of the data in one of the plurality of pages divided by two, the group is the one of the pages, the plurality of data states for the memory cells operating as the single-level cells includes, in order of increasing threshold voltage, an erase state and a programmed state, the plurality of data states for the memory cells operating as the multi-level cells includes, in order of increasing threshold voltage, the erase state and a plurality of programmed data states, and the predetermined block type check read level is one of a single-level memory cell read level or a first programmed data state read level associated with a first one of the plurality of programmed data states.

18. The method as set forth in claim 15, wherein the memory apparatus further includes an error correcting code engine configured to decode the data read from the memory cells to detect errors and the method further includes the steps of:

determining whether deep read error handling associated with the occurrence of at least one failure to decode the data is triggered in the read error handling operation for the one of the blocks in response to determining the memory cells of one of the blocks were previously used as the multi-level cells and the next usage of the memory cells of one of the blocks is as the single-level cells;

performing the next regular operation in response to determining the deep read error handling associated with the occurrence of at least one failure to decode the data is not triggered in the read error handling operation for the one of the blocks;

marking the one of the blocks as having a first read error handling strike and setting a counter to one in response to determining the deep read error handling associated with the occurrence of at least one failure to decode the data is triggered in the read error handling operation for the one of the blocks;

determining whether the deep read error handling is triggered again in the read error handling operation for the one of the blocks;

determining the memory cells of the one of the blocks should be used as the multi-level cells only in response to determining the deep read error handling is not triggered again in the read error handling operation for the one of the blocks; and marking the one of the blocks as a bad block and do not use the memory cells of the one of the blocks in response to determining the deep read error handling is triggered again in the read error handling operation for the one of the blocks.

19. The method as set forth in claim 18, further including the steps of:

reading the data from the memory cells of the one of the blocks in a first read operation;

decoding the data read from the memory cells of the one of the blocks in the first read operation;

triggering the read error handling operation and perform additional soft bit reads in response to a failure to decode the data read from the memory cells of the one of the blocks in the first read operation;

logically exclusive oring the data read from the memory cells of the one of the blocks in the first read operation and the data of the memory cells of the one of the blocks being read in the first read operation and determining the deep read error handling is triggered;

reading the data from the memory cells of the one of the blocks in a second read operation;

decoding the data read from the memory cells of the one of the blocks in the second read operation;

triggering the read error handling operation and perform the additional soft bit reads in response to a failure to decode the data read from the memory cells of the one of the blocks in the second read operation; and logically exclusive oring the data read from the memory cells of the one of the blocks in the second read operation and the data of the memory cells of the one of the blocks being read in the second read operation and determining the deep read error handling is triggered again.

20. The method as set forth in claim 14, wherein the memory cells operating as the multi-level cells store three bits or four bits of the data per each of the memory cells and are triple-level cells or four-level cells.

* * * * *